(12) United States Patent
Saitoh et al.

(10) Patent No.: US 8,710,485 B2
(45) Date of Patent: Apr. 29, 2014

(54) SEMICONDUCTOR DEVICE AND METHOD OF MANUFACTURING THE SAME

(75) Inventors: Masumi Saitoh, Yokohama (JP);
Toshinori Numata, Kamakura (JP);
Kiwamu Sakuma, Yokohama (JP);
Haruka Kusai, Yokohama (JP);
Takayuki Ishikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 169 days.

(21) Appl. No.: 13/458,042

(22) Filed: Apr. 27, 2012

(65) Prior Publication Data

US 2012/0273747 A1 Nov. 1, 2012

(30) Foreign Application Priority Data

Apr. 28, 2011 (JP) ................................ 2011-100790

(51) Int. Cl.
*H01L 29/06* (2006.01)
*H01L 47/00* (2006.01)

(52) U.S. Cl.
USPC .......................................................... 257/5

(58) Field of Classification Search
CPC ............ H01L 29/792; H01L 29/66833; H01L 29/7926; H01L 27/11582
USPC ......... 257/5, E25.006, E21.679, E27.103, 57, 257/E27.002, E21.645, E27.03, 213–413, 257/900, 902–903, E27.078, 257/E29.3–E29.309, 68–71, 905–908, 257/E27.084–E27.097, E27.075; 438/285, 438/22, 24, 48; 365/18.17
See application file for complete search history.

(56) References Cited

U.S. PATENT DOCUMENTS

| 8,513,725 B2* | 8/2013 | Sakuma et al. ............... 257/314 |
| 8,546,779 B2* | 10/2013 | Sonehara ......................... 257/2 |
| 2006/0118876 A1* | 6/2006 | Lee et al. ...................... 257/365 |
| 2006/0220131 A1* | 10/2006 | Kinoshita et al. ............ 257/347 |
| 2007/0290223 A1* | 12/2007 | Yagishita ....................... 257/103 |
| 2009/0309152 A1* | 12/2009 | Knoefler et al. .............. 257/324 |
| 2010/0197099 A1* | 8/2010 | Kim et al. ...................... 438/299 |
| 2011/0233507 A1* | 9/2011 | Sonehara et al. ................. 257/4 |
| 2012/0139030 A1* | 6/2012 | Sakuma et al. ............... 257/326 |
| 2013/0015520 A1* | 1/2013 | Shosuke et al. .............. 257/324 |

FOREIGN PATENT DOCUMENTS

| JP | 2004-152893 | 5/2004 |
| JP | 2008-78404 | 4/2008 |
| JP | 2009-27136 | 2/2009 |

OTHER PUBLICATIONS

Masumi Saitoh, et al., "Short-Channel Performance Improvement by Raised Source/Drain Extensions With Thin Spacers in Trigate Silicon Nanowire MOSFETs", IEEE Electron Device Letters, vol. 32, No. 3, Mar. 2011, pp. 273-275.

* cited by examiner

*Primary Examiner* — Dao H Nguyen
*Assistant Examiner* — Tram H Nguyen
(74) *Attorney, Agent, or Firm* — Oblon, Spivak, McClelland, Maier & Neustadt, L.L.P.

(57) ABSTRACT

According to one embodiment, a semiconductor device includes a fin type stacked layer structure which has first to third semiconductor layers, and first to third layer select transistors to select one of the first to third semiconductor layers. The second layer select transistor is normally on in the second semiconductor layer, and is controlled to be on or off in the first and third semiconductor layers. A channel region of the second semiconductor layer which is covered with a gate electrode of the second layer select transistor has a metal silicide.

34 Claims, 31 Drawing Sheets

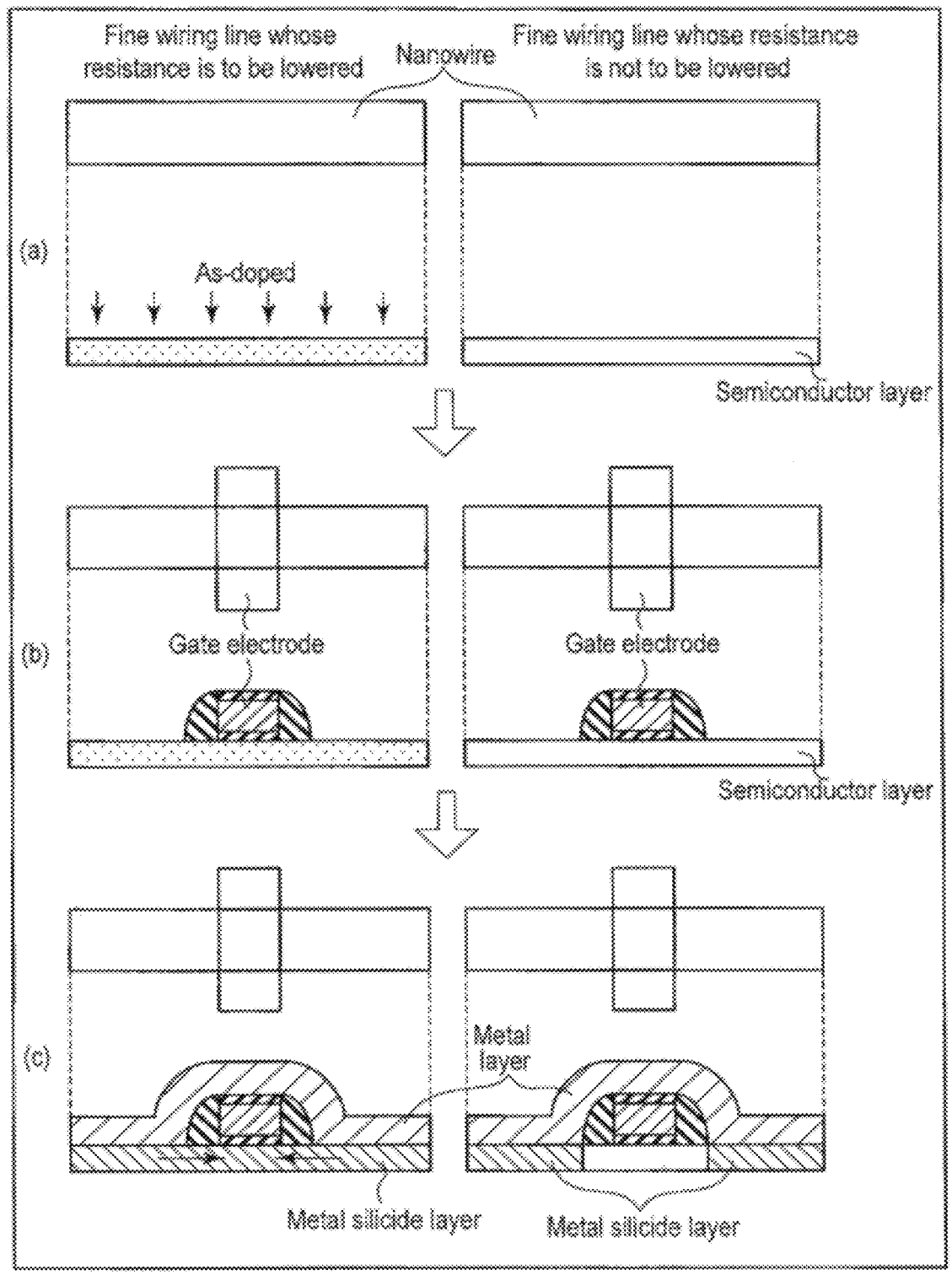
F I G. 6

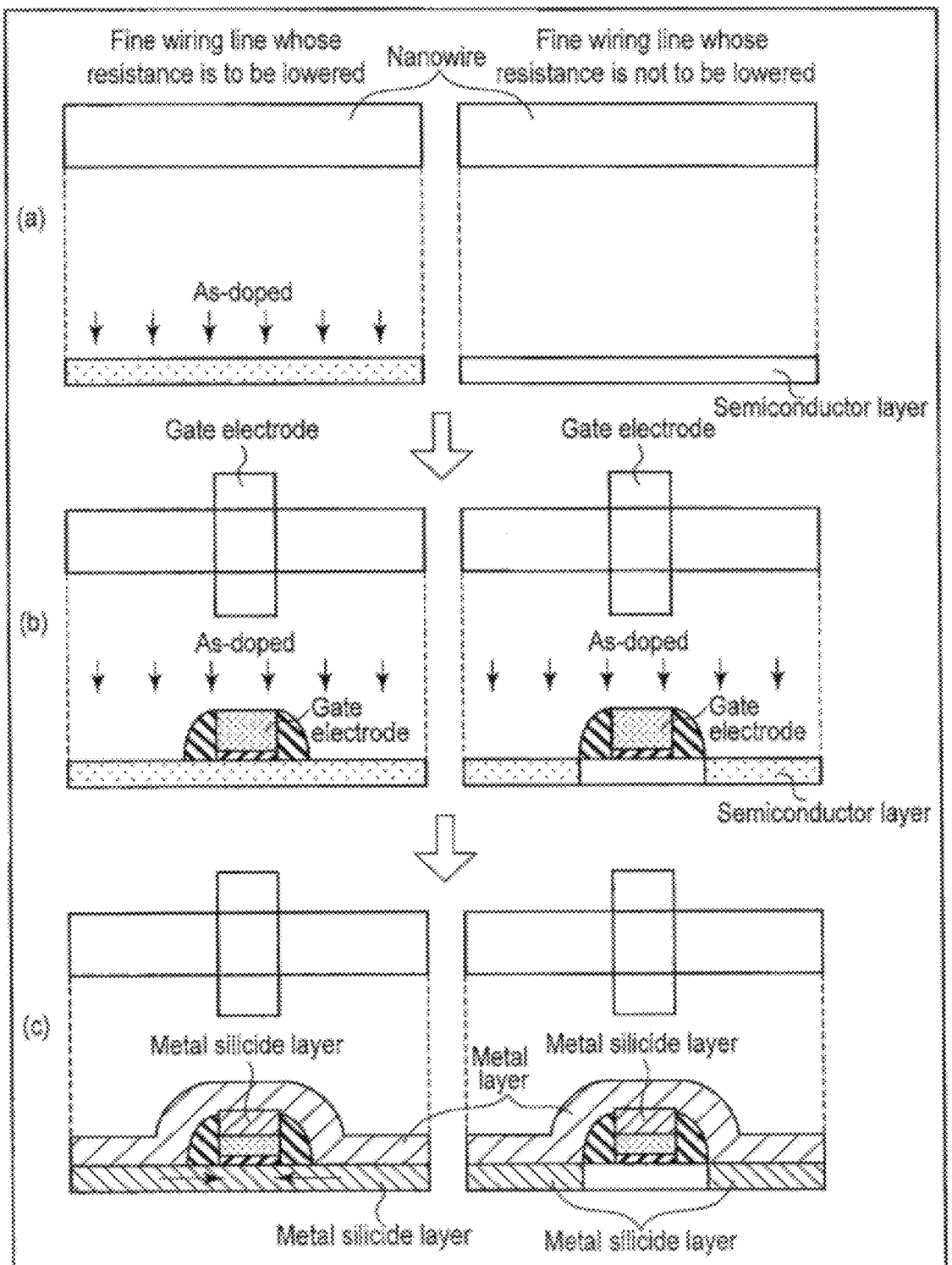
F I G. 7

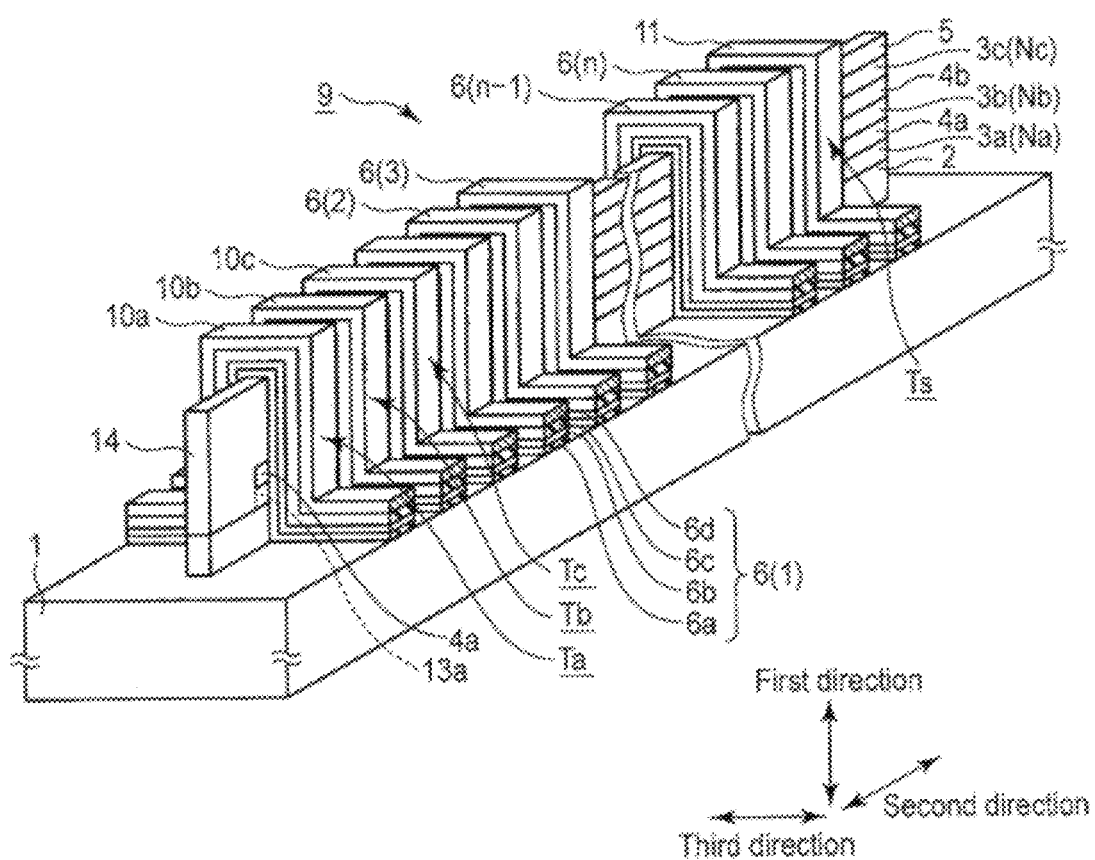
F I G. 15

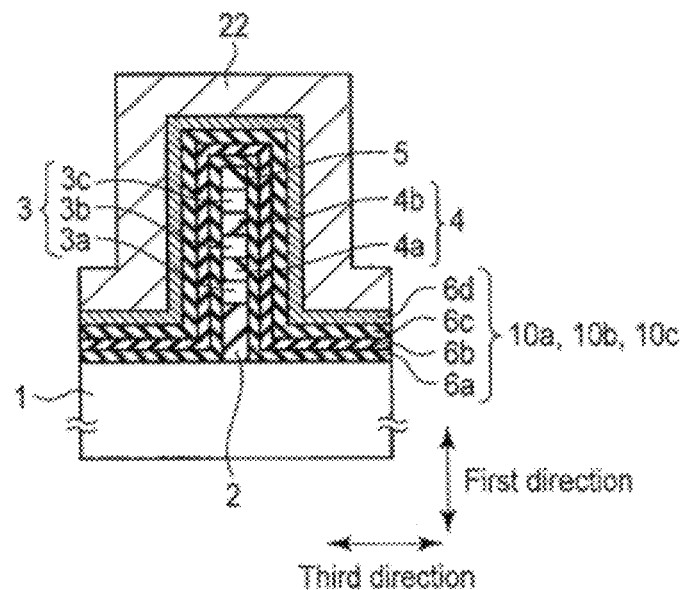
F I G. 19
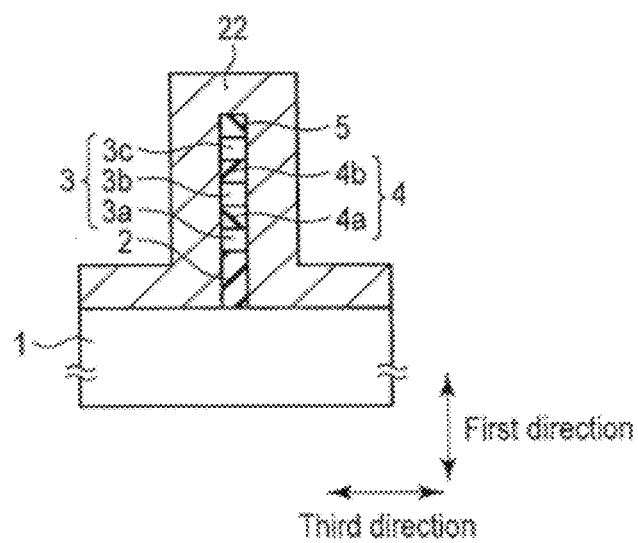
F I G. 20

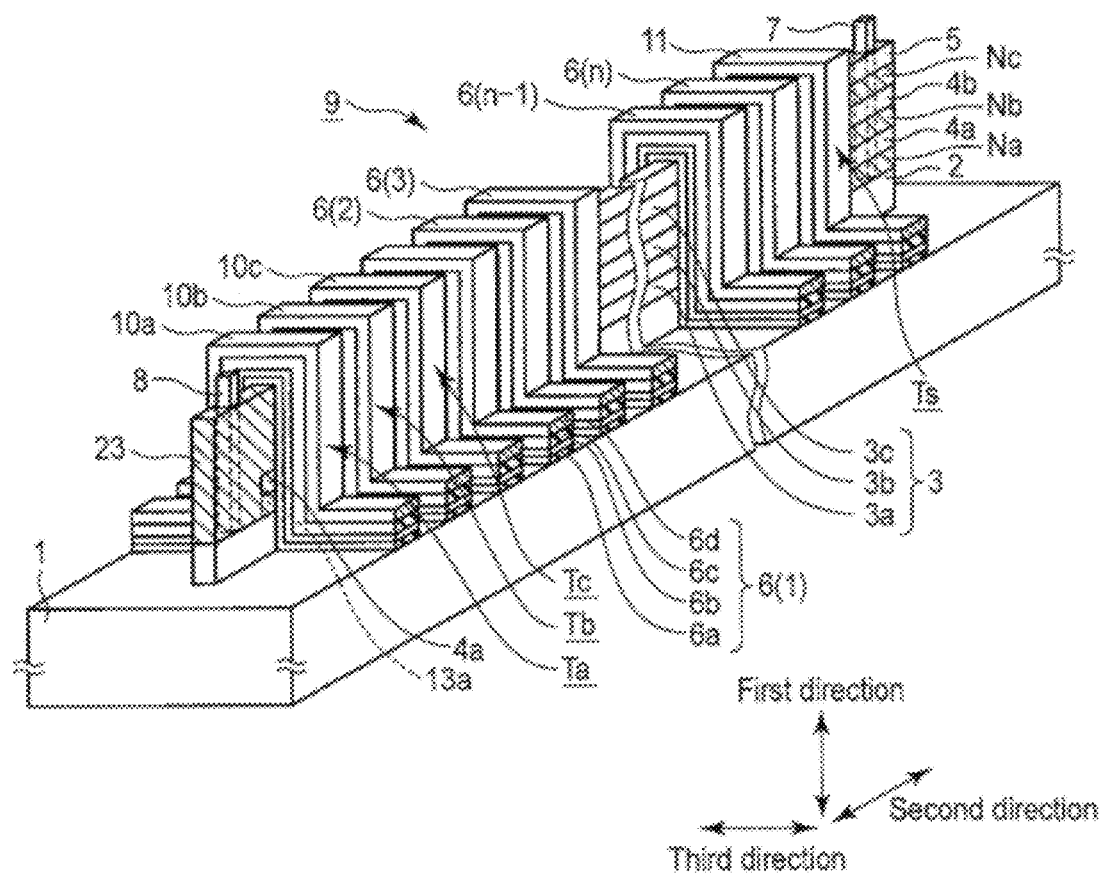
F I G. 21

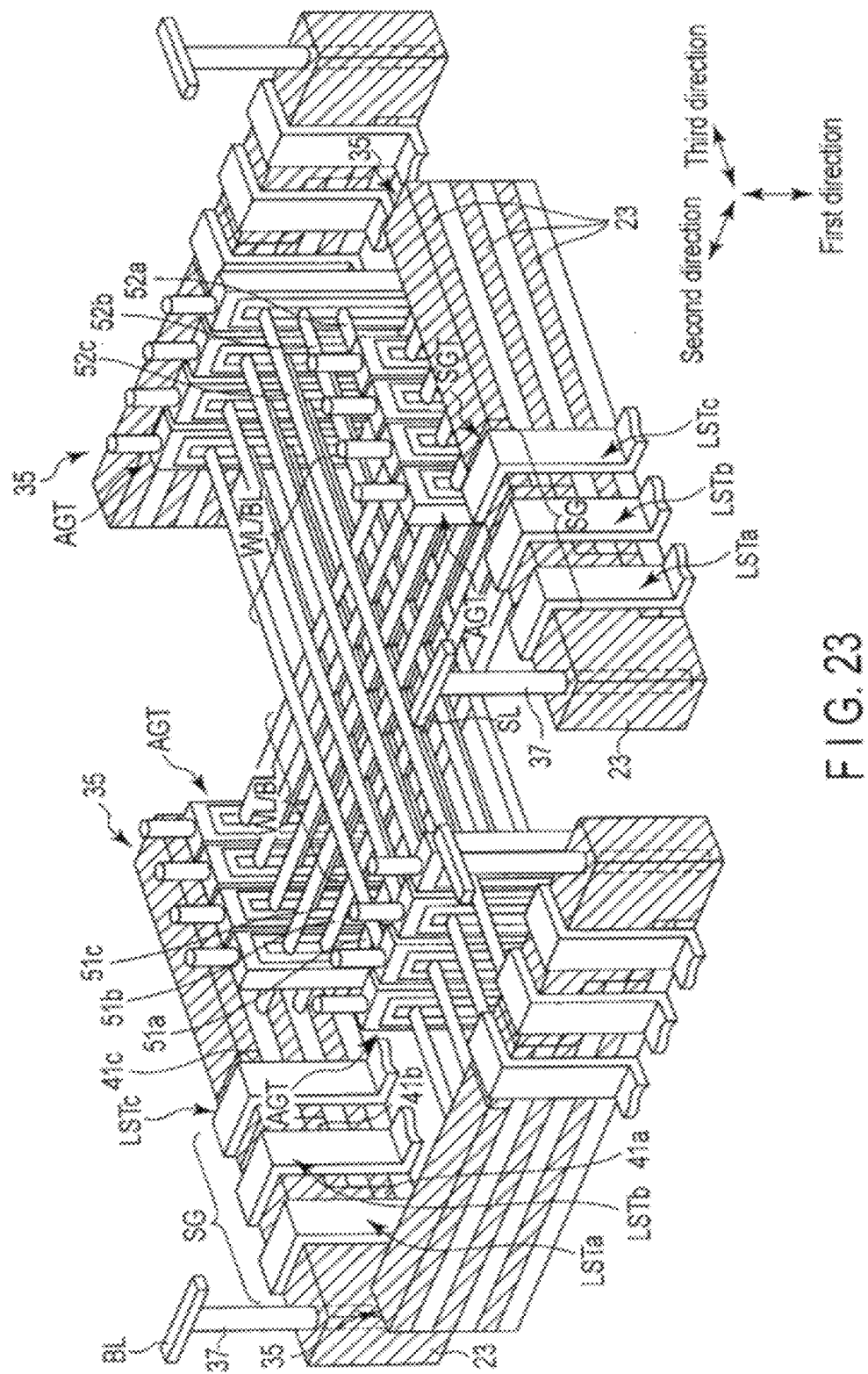
F I G. 23

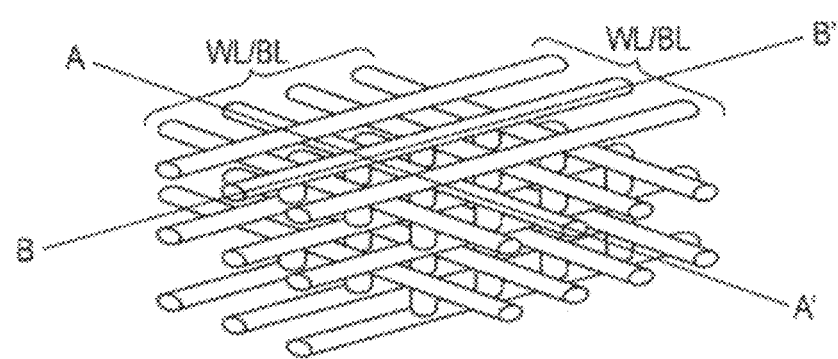
F I G. 24

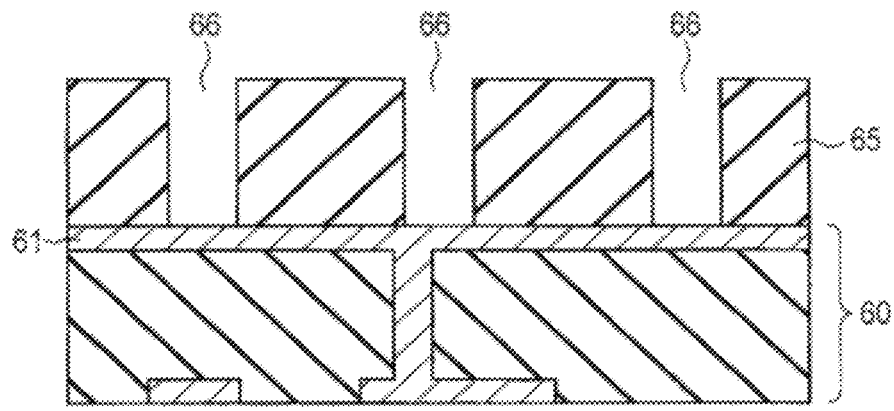
F I G. 30
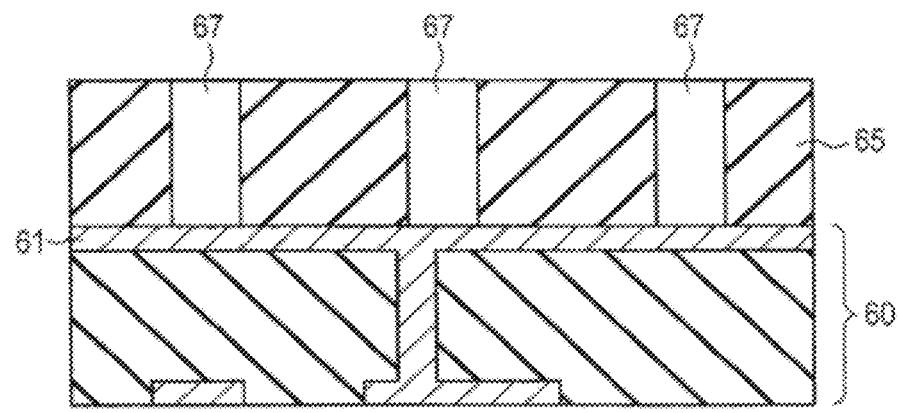
F I G. 31

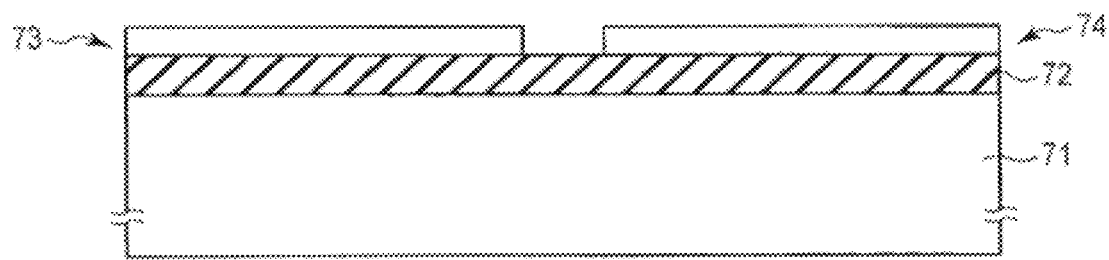
F I G. 38
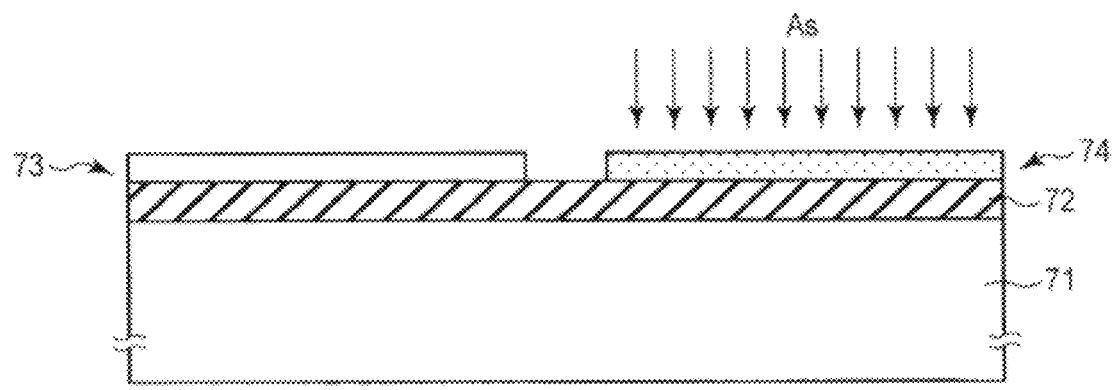
F I G. 39

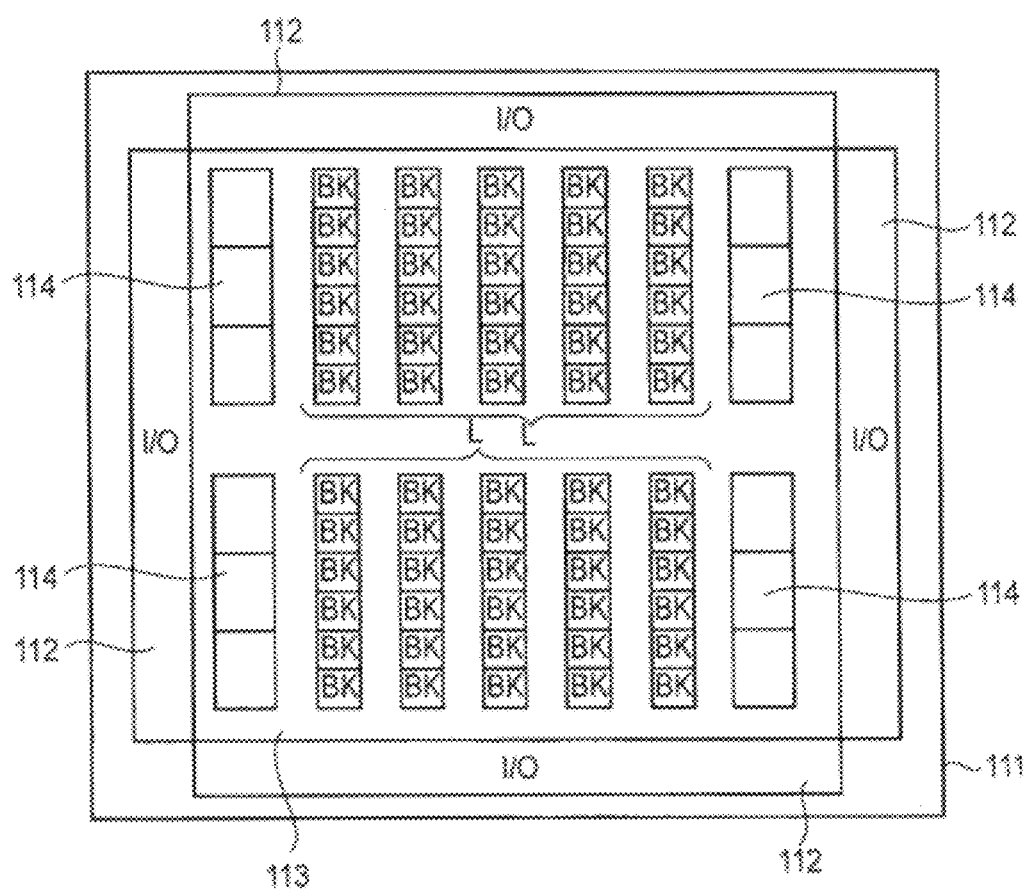
F I G. 43

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2011-100790, filed Apr. 28, 2011, the entire contents of which are incorporated herein by reference.

FIELD

Embodiments described herein relate generally to a semiconductor device and a method of manufacturing the same.

BACKGROUND

Heretofore, higher integration of a logic LSI and a nonvolatile memory LSI has been realized by reducing sizes of devices constituting them. In recent years, however, difficulty of fine pattern processing has increased, and device stacking (LSI three-dimensional stacking) has extensively been investigated as a technique of enhancing the integration without relying on fineness.

In general, an active layer of a transistor or a diode constituting the three-dimensional structure LSI is a semiconductor surrounded with an insulator, but to realize the higher integration, it is necessary to reduce the size of the semiconductor. In consequence, the semiconductor as the active layer often becomes a fine wire (nanowire) shape having a size of several tens of nanometers or less. When the active layer has the nanowire shape, a wiring section for accessing the individual devices also has the nanowire shape, but it is known that it is difficult to implant a highly concentrated impurity in the semiconductor having the nanowire shape, and the resistance of the semiconductor becomes high. When the resistance of the wiring section becomes high, the deterioration of an operation speed of the LSI becomes a problem.

To lower the resistance of the wiring section, it can be contrived that the wiring section is made of a metal, but the fine pattern processing of the metal is very difficult. Accordingly, a technology of forming a fine wiring line of a low resistance by a simple process is required.

BRIEF DESCRIPTION OF THE DRAWINGS

FIG. 6 and FIG. 7 are views showing a basic principle;

FIG. 11 to FIG. 21 are views showing a method of manufacturing the device of FIG. 8;

FIG. 23 is a view showing a three-dimensional memory device as a third embodiment;

FIG. 24 is a view showing a memory cell array of FIG. 23;

FIG. 30 to FIG. 33 are views showing a method of manufacturing a device of FIG. 27;

FIG. 37 to FIG. 41 are views showing a method of manufacturing the device of FIG. 35;

FIG. 43 is a view showing a chip layout of the FPGA;

DETAILED DESCRIPTION

In general, according to one embodiment, a semiconductor device comprises: a semiconductor substrate; a fin type stacked layer structure which has first to n-th semiconductor layers (n is a natural number equal to or more than 2) that are stacked in a first direction perpendicular to a surface of the semiconductor substrate and which extends in a second direction parallel to the surface of the semiconductor substrate; and first to n-th layer select transistors to select one of the first to n-th semiconductor layers, wherein the i-th layer select transistor (i is one of 1 to n) among the first to n-th layer select transistors has a gate electrode which extends in the first direction on the surface of the fin type stacked layer structure that is located in a third direction perpendicular to the first and second directions, is normally on in the i-th semiconductor layer among the first to n-th semiconductor layers, and is controlled to be on or off in the remaining semiconductor layers other than the i-th semiconductor layer, and a channel region of the i-th semiconductor layer which is covered with the gate electrode of the i-th layer select transistor has a metal silicide.

Hereinafter, embodiments will be described with reference to the drawings.

1. Principle

In embodiments, there has been suggested a technology of selectively bringing a fine wire (nanowire) semiconductor to a metal silicide, to simply lower a resistance of a fine wiring line. As described above, it is difficult to lower a resistance value of the fine wire semiconductor by doping it with a highly concentrated impurity. Therefore, in the embodiments, the fine wire semiconductor has the metal silicide, whereby lowering the resistance of the fine wiring line is realized.

However, when the fine wire semiconductor has the metal silicide, the silicide formation does not easily proceed, or conversely the silicide formation is promoted, depending on conditions.

Therefore, it is first necessary to investigate conditions on which bringing the fine wire semiconductor to the metal silicide is promoted.

Figure 1:
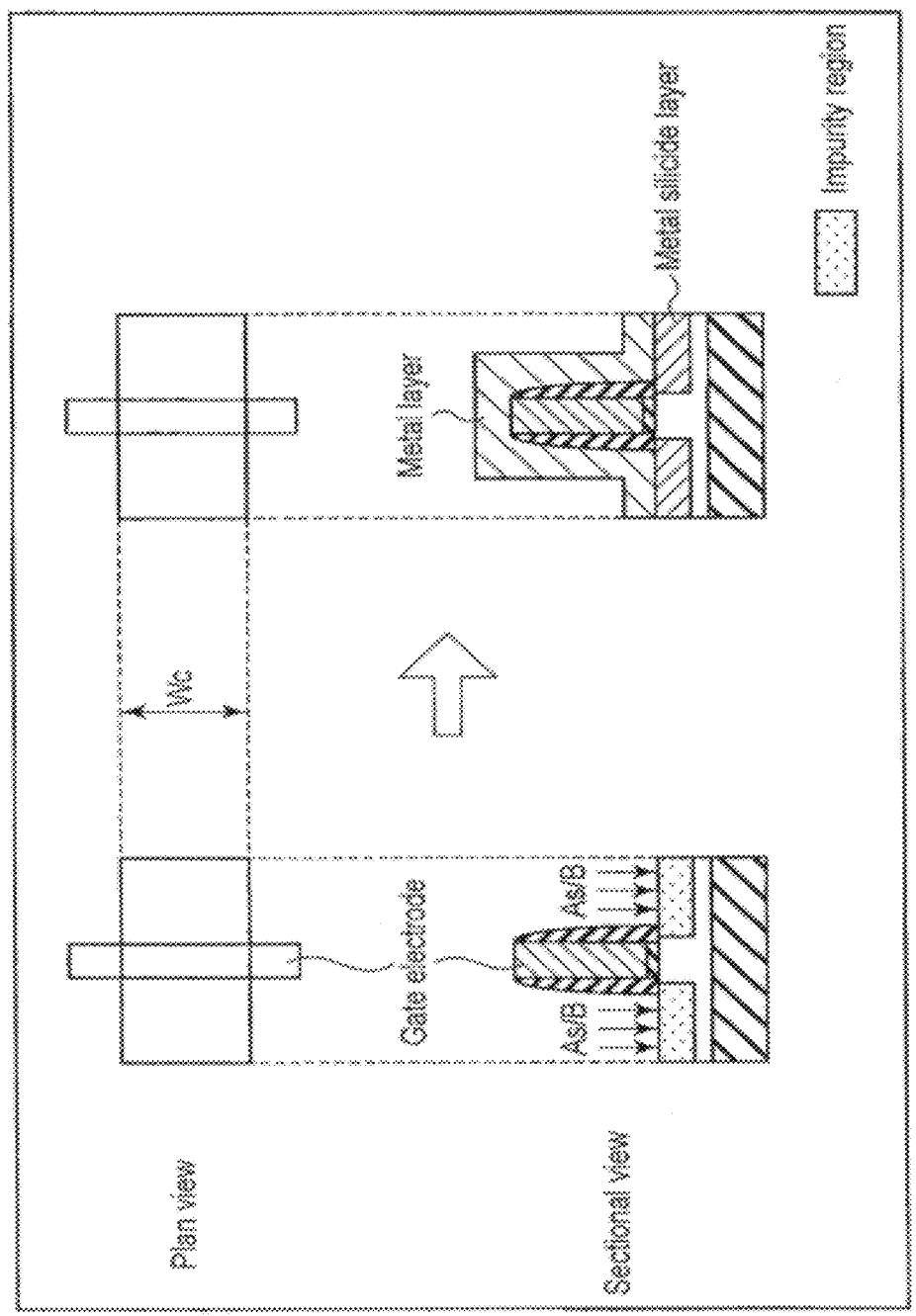
FIG. 1 and FIG. 2 are explanatory views of a principle of metal silicide formation.

FIG. 1 shows an outline of a silicide experiment of the nanowire semiconductor.

A sample of this experiment is a field effect transistor (FET) in which the nanowire semiconductor (Si) is an active layer. This sample is formed by the following steps.

First, on an SOI substrate (a semiconductor layer thickness of 16 nm), a nanowire transistor (the transistor in which a channel section has a fine wire shape) is formed. That is, a gate electrode (a polysilicon gate) and a side wall insulating layer (SiN) are formed, and then, while using them as masks, ion implantation of arsenic (As) or boron (B) of a dose amount $1 \times 10^{15}$ cm$^{-2}$ is performed through self alignment, to form a source/drain region. Afterward, on the source/drain region, a metal layer (NiPt) having a thickness of 4 nm is formed, followed by a heat treatment to react the semiconductor layer with the metal layer, thereby forming a metal silicide layer.

A portion of the above sample in which the metal silicide layer is formed is verified by changing a width of the nanowire semiconductor (corresponding to a channel width of the FET) and a type of the impurity constituting the source/drain region.

A first sample is an FET in which a width (a channel width) of a nanowire semiconductor (Si) is 100 nm, and a source/drain region is doped with arsenic (As). This sample has a metal silicide by a heat treatment, and a TEM plane image of the thus treated sample is shown in FIG. 2(a).

Figure 2:
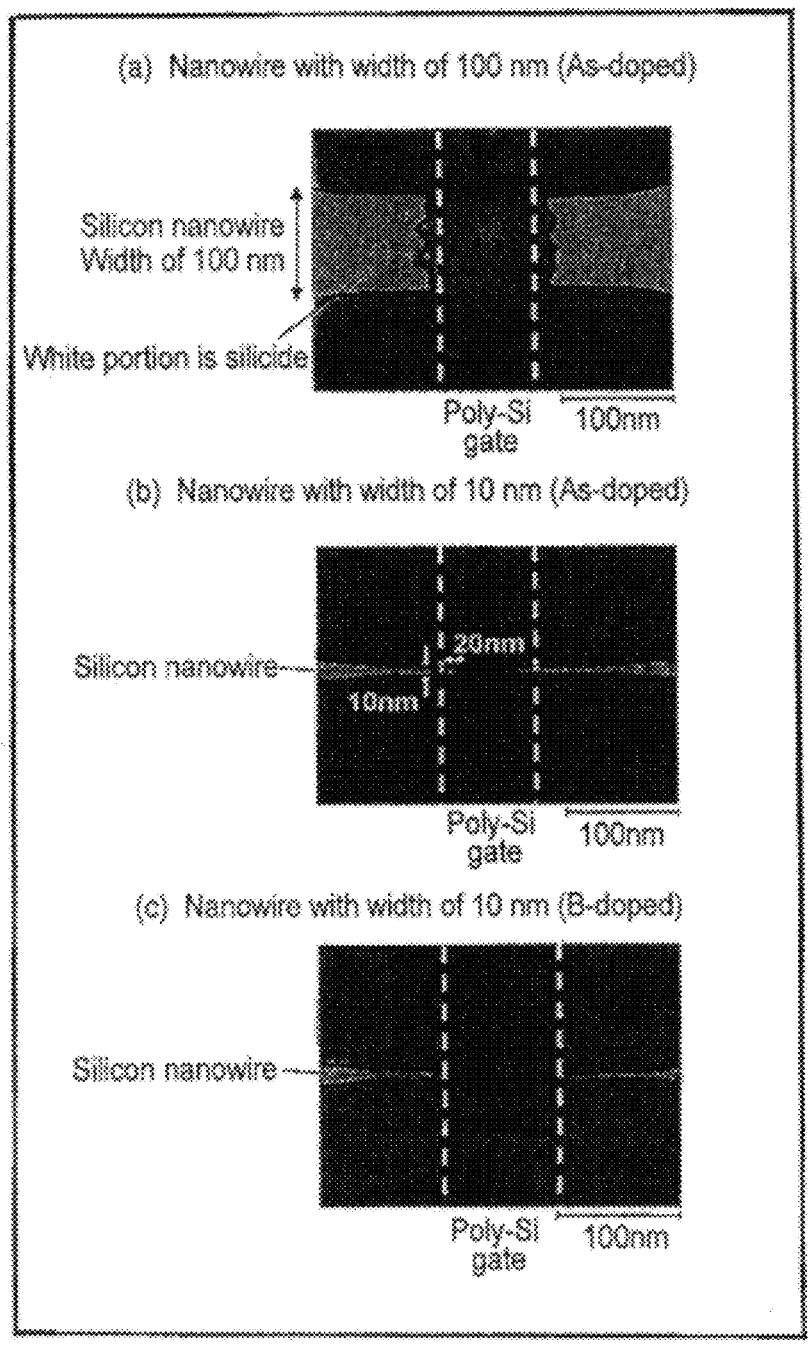

In FIG. 2(a), a region sandwiched between broken lines (white) corresponds to a gate electrode (a poly-Si gate). A metal layer (NiPt) for silicide formation does not come in contact with the nanowire semiconductor of a channel section covered with the gate electrode. A metal silicide layer (a nickel silicide layer) formed by a reaction between the metal layer and the nanowire semiconductor is a region which is surrounded with a black bold line and looks white in FIG. 2(a). As seen from this result, in this sample, the metal silicide layer is formed only in the source/drain region, and is not formed in the channel section of the FET.

A second sample is an FET in which a width (a channel width) of a nanowire semiconductor (Si) is 10 nm, and a source/drain region is doped with arsenic (As). This sample has a metal silicide by a heat treatment, and a TEM plane image of the thus treated sample is shown in FIG. 2(b).

In FIG. 2(b), a region sandwiched between broken lines (white) corresponds to a gate electrode (a poly-Si gate). A metal layer (NiPt) for silicide formation does not come in contact with the nanowire semiconductor of a channel section covered with the gate electrode. A metal silicide layer (a nickel silicide layer) formed by a reaction between the metal layer and the nanowire semiconductor is a region which is surrounded with a black bold line and looks white in FIG. 2(b). As seen from this result, in this sample, the metal silicide layer is formed in the source/drain region, and intrudes into the channel section of the FET as much as about 20 nm.

A third sample is an FET in which a width (a channel width) of a nanowire semiconductor (Si) is 10 nm, and a source/drain region is doped with boron (B). This sample has a metal silicide by a heat treatment, and a TEM plane image of the thus treated sample is shown in FIG. 2(c).

In FIG. 2(c), a region sandwiched between broken lines (white) corresponds to a gate electrode (a poly-Si gate). A metal layer (NiPt) for silicide formation does not come in contact with the nanowire semiconductor of a channel section covered with the gate electrode. A metal silicide layer (a nickel silicide layer) formed by a reaction between the metal layer and the nanowire semiconductor is a region which is surrounded with a black bold line and looks white in FIG. 2(c). As seen from this result, in this sample, the metal silicide layer is formed only in the source/drain region, and is not formed in the channel section of the FET.

It is seen from the above experiment results that when the width of the nanowire semiconductor narrows, the metal silicide layer can be formed in a region other than the region where the metal layer comes in contact with the semiconductor layer. Moreover, it is seen from this experiment result that when the semiconductor layer is beforehand doped with boron, the silicide formation is suppressed, and that when the semiconductor layer is beforehand doped with arsenic, the silicide formation is promoted.

Causes for the promotion of the silicide reaction between the metal layer and the semiconductor layer include, as a first cause, a capillary phenomenon which occurs when the width of the nanowire semiconductor narrows. That is, when the width of the nanowire semiconductor narrows, the metal silicide layer also penetrates the semiconductor layer covered with the gate electrode.

However, as seen from the results of FIGS. 2(b) and (c), even in the nanowire semiconductors having the same width, a degree of the promotion of the silicide reaction noticeably varies, depending on a type of an impurity implanted in the semiconductor layer. Concerning this, it has been confirmed in the experiment results that the semiconductor layer is amorphized by the ion implantation of arsenic, but the amorphization of the semiconductor layer by the ion implantation of boron has hardly been confirmed.

Therefore, as a second cause for the promotion of the silicide reaction between the metal layer and the semiconductor layer, the amorphization of the nanowire semiconductor by the implantation of the impurity in the semiconductor layer is presumed.

That is, the impurity is not limited to arsenic as long as the semiconductor layer is amorphized, and the other impurities also exert an effect of promoting the silicide formation. Moreover, when the semiconductor layer is not amorphized, an effect of suppressing the silicide formation is exerted.

That is, when the monocrystalline or polycrystalline semiconductor layer is beforehand formed and brought to the silicide while maintaining the crystal state of the semiconductor layer, the silicide reaction is not promoted. Therefore, means for suppressing the silicide formation is not limited to the doping with boron, as long as the semiconductor layer is not amorphized. The layer may be doped with another impurity. Moreover, the semiconductor layer is not doped with the impurity, whereby the layer can be prevented from being brought to the silicide.

Figure 3:
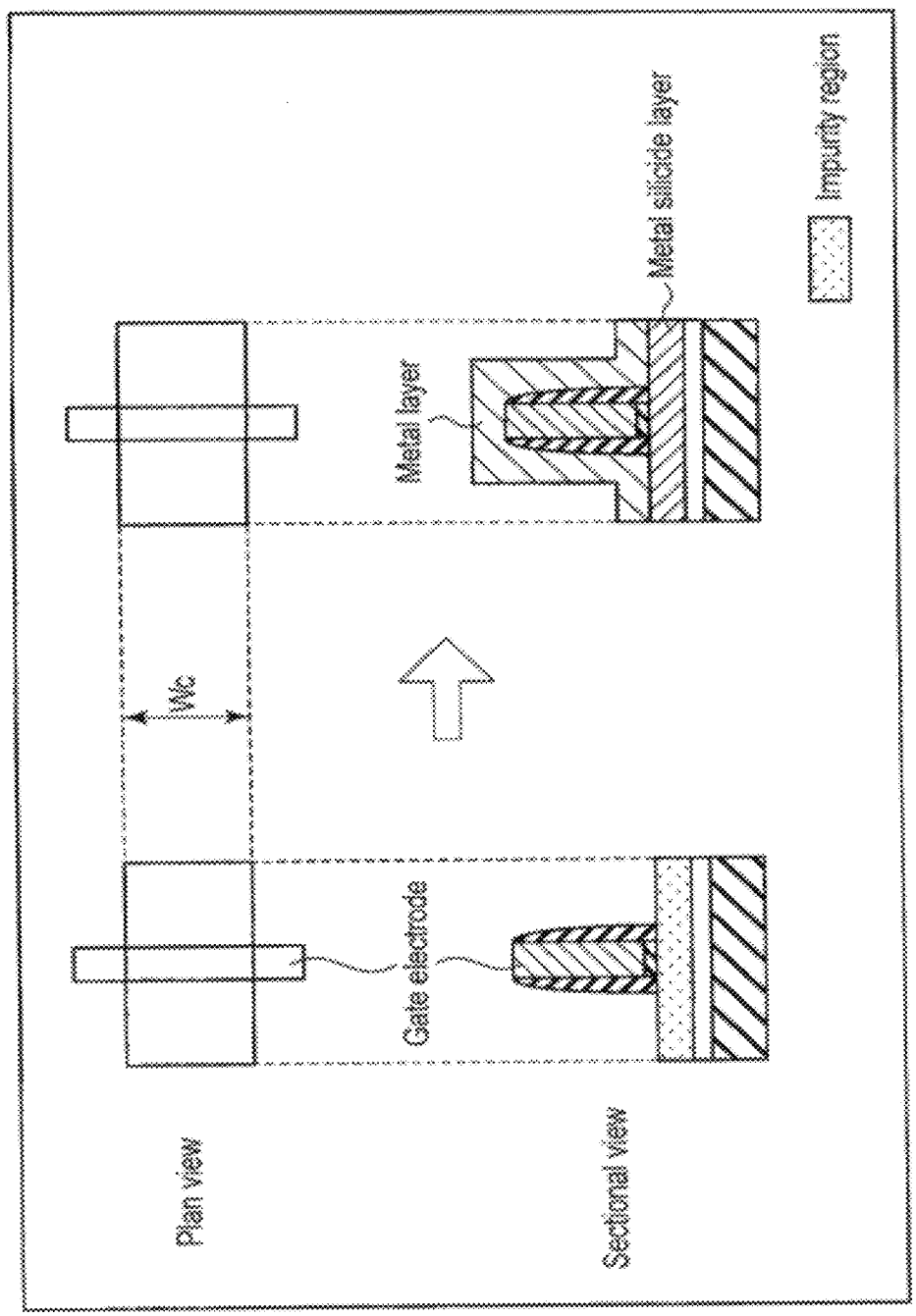
FIG. 3 is a view showing an experiment result of the metal silicide formation.

The sample of FIG. 1 is modified on the basis of the above results to constitute a sample of FIG. 3. This sample is characterized in ion implantation of arsenic in the whole nanowire semiconductor (including the channel section covered with the gate electrode), and the other respects are the same as in the sample of FIG. 1.

This sample is an FET in which a nanowire semiconductor (Si) has a width (a channel width) of 10 nm, and the whole nanowire semiconductor is doped with arsenic (As). It is considered that when this sample has a metal silicide by a heat treatment, the metal silicide layer is formed entirely in the source/drain region and the channel section of the FET.

It is seen from the above experiment results that when the capillary phenomenon caused by narrowing the width of the nanowire semiconductor is combined with the amorphization of the nanowire semiconductor caused by implanting the impurity, the silicide reaction can noticeably be promoted.

Figure 4:
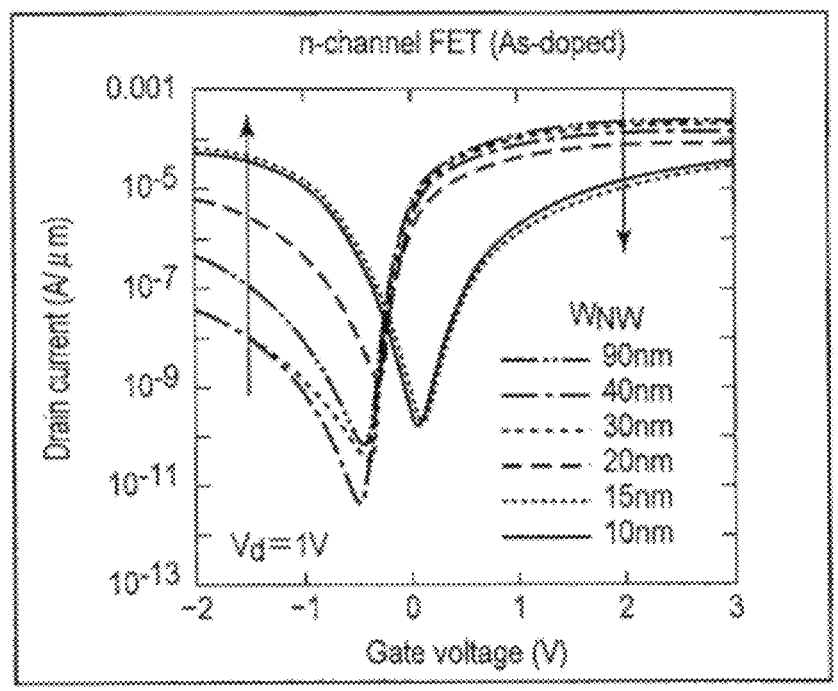
FIG. 4 and FIG. 5 are diagrams showing a relation between a nanowire width and the metal silicide formation.
Figure 5:
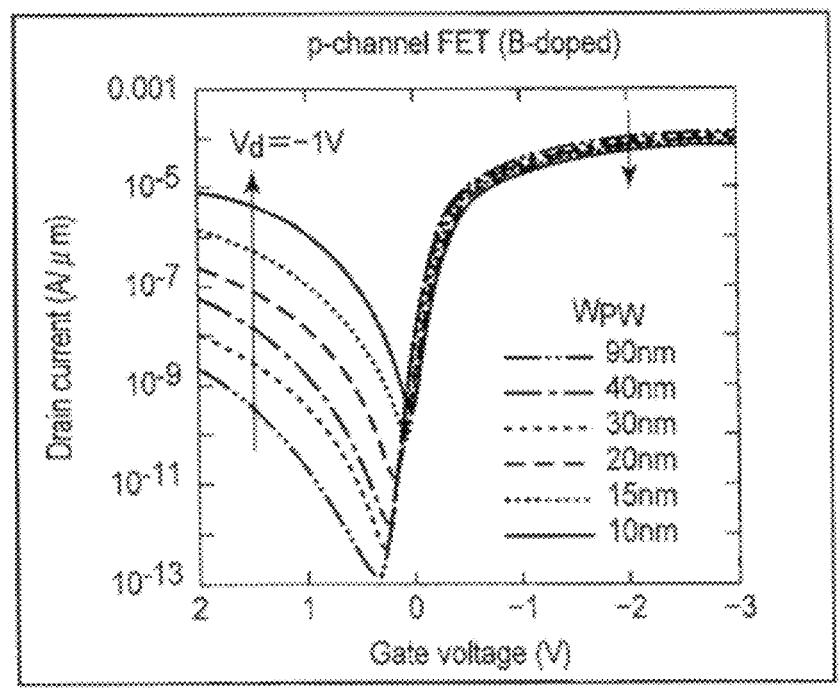

FIG. 4 and FIG. 5 show data which supports the above experiment results.

In this I-V characteristic, when a drain voltage Vd is 1 V, the width (the channel width) of the nanowire semiconductor is used as a parameter, and a relation between a gate voltage and a drain current is described.

According to these diagrams, when the width (the channel width) of the nanowire semiconductor is 15 nm or smaller, the above experiment results are remarkably reflected.

That is, in an n-channel FET (FIG. 4) doped with arsenic (As), when the width of the nanowire semiconductor changes from 20 nm to 15 nm, the drain current discontinuously noticeably decreases in a plus gate voltage, and the drain current noticeably increases in a minus gate voltage. This means that when the width of the nanowire semiconductor is 15 nm, the source/drain region and the channel region of the FET change to Schottky contact. That is, it is evidently indicated that the capillary phenomenon and the amorphization of the semiconductor layer allow the metal silicide layer of the source/drain region to penetrate the channel region right under the gate electrode.

In contrast, even when the width of the nanowire semiconductor narrows in a p-channel FET doped with boron (B) (FIG. 5), the discontinuous change of the drain current is not seen in the plus gate voltage. Consequently, it is seen that in the nanowire semiconductor doped with boron, the semiconductor layer is not amorphized, and the penetration of the metal silicide layer into the channel region right under the gate electrode is suppressed.

A basic principle of an embodiment in which a resistance of a fine wiring line (including the channel section of the FET) is simply lowered will be described on the basis of the above-mentioned experiment results.

Here, to facilitate the understanding of the present principle, there will be described an example in which a fine wiring line whose resistance is to be lowered and a fine wiring line whose resistance is not to be lowered are formed in parallel.

FIG. 6 shows the basic principle of the embodiment.

First, in a monocrystalline semiconductor layer (e.g., a silicon nanowire) which becomes a base of the fine wiring line whose resistance is to be lowered, the ion implantation of the impurity (e.g., arsenic) to amorphize the semiconductor layer is performed (see (a) of the same drawing).

Moreover, the fine wiring line whose resistance is not to be lowered is covered with a mask material. In the present example, the mask material is a gate electrode of an FET (see (b) of the same drawing).

Furthermore, a metal layer is formed on the semiconductor layer which is not covered with the gate electrode, followed by a heat treatment, whereby a silicide reaction occurs between the metal layer and the semiconductor layer (see (c) of the same drawing).

At this time, in the fine wiring line whose resistance is to be lowered, the silicide reaction in a direction parallel to an interface between the metal layer and the semiconductor layer is promoted. Consequently, the resistance of the fine wiring line is lowered. Moreover, in the fine wiring line whose resistance is not to be lowered, the silicide reaction in the direction parallel to the interface between the metal layer and the semiconductor layer is suppressed. Consequently, the resistance of the fine wiring line is not lowered.

FIG. 7 shows a modification of FIG. 6.

This example is characterized in that a gate electrode is constituted of a semiconductor layer (e.g., polysilicon), and a resistance of a fine wiring line is lowered simultaneously with a self-aligned silicide process of the gate electrode and a source/drain region.

First, in a monocrystalline semiconductor layer (e.g., a silicon nanowire) which becomes a base of the fine wiring line whose resistance is to be lowered, the ion implantation of an impurity (e.g., arsenic) to amorphize the semiconductor layer is performed (see (a) of the same drawing).

Moreover, the fine wiring line whose resistance is not to be lowered is covered with a mask material. In the present example, the mask material is a polysilicon gate electrode (see (b) of the same drawing).

Furthermore, a metal layer is formed on the gate electrode and the semiconductor layer, followed by a heat treatment, whereby a silicide reaction occurs between the metal layer and the semiconductor layer (including the gate electrode) (see (c) of the same drawing).

At this time, in the fine wiring line whose resistance is to be lowered, the silicide reaction in a direction parallel to an interface between the metal layer and the semiconductor layer is promoted, with the result that the resistance of the fine wiring line is lowered. Moreover, in the fine wiring line whose resistance is not to be lowered, the silicide reaction in the direction parallel to the interface between the metal layer and the semiconductor layer is suppressed, with the result that the resistance of the fine wiring line is not lowered.

According to this basic principle, it is possible to simply lower the resistances of the fine wiring lines in various semiconductor devices as described in the following embodiments. Moreover, this principle is effective for the semiconductor device requested to be manufactured simply (at low cost), especially when a structure is miniaturized and complicated as in a three-dimensional structure LSI.

Additionally, in the present principle, examples of an impurity to promote the metal silicide formation (the impurity to amorphize the semiconductor layer) include arsenic, and additionally include phosphor (P), silicon (Si), germanium (Ge), fluorine (F), and carbon (C).

Moreover, examples of an impurity to suppress the metal silicide formation (the impurity which does not amorphize the semiconductor layer) include boron. However, the impurity is not implanted in a region which is not to be brought to the metal silicide. Even in this case, it is possible to obtain an effect of suppressing the metal silicide formation.

2. Embodiment (1) First Embodiment

A. Structure

Figure 8:
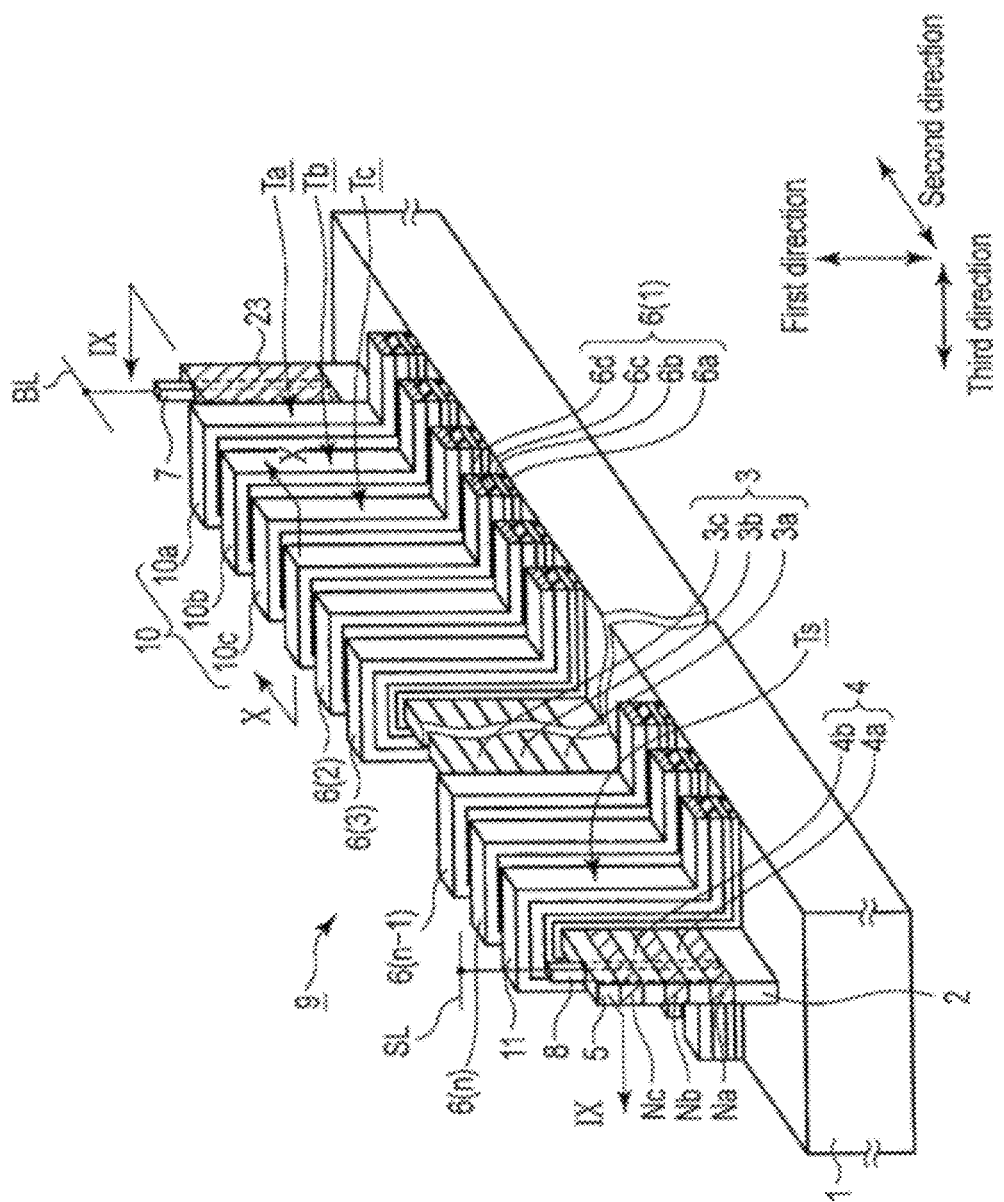
FIG. 8 is a view showing a three-dimensional memory device as a first embodiment.
Figure 9:
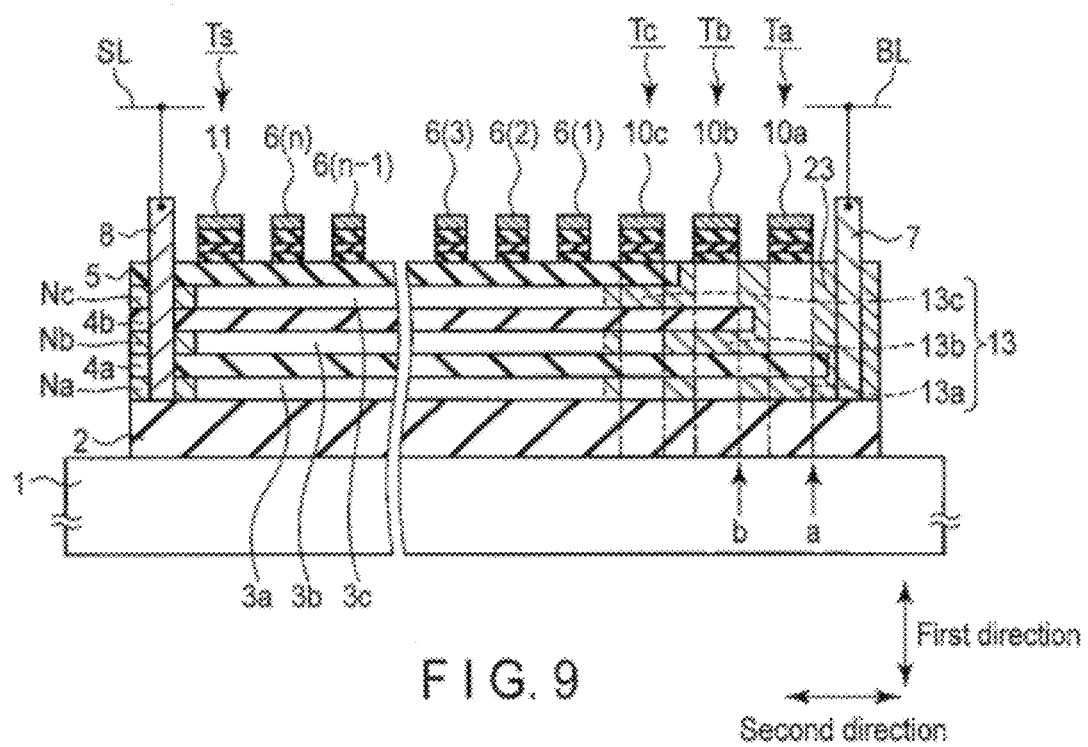
FIG. 9 is a sectional view taken along IX-IX line of FIG. 8.
Figure 10:
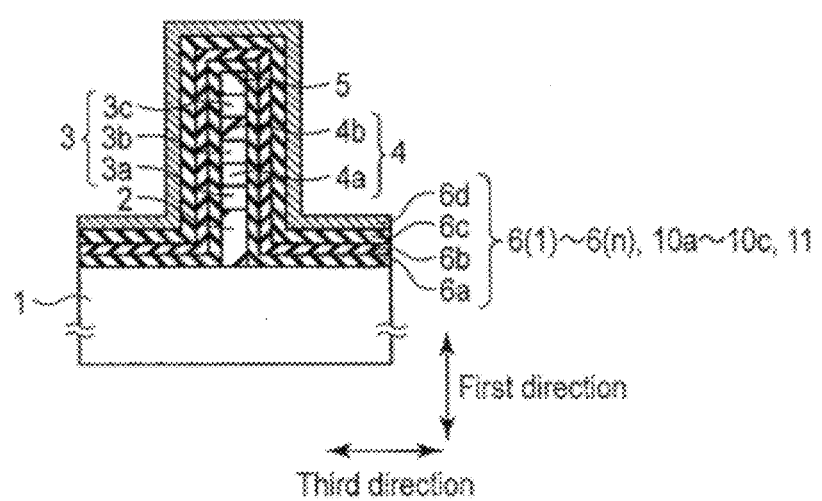
FIG. 10 is a sectional view taken along X-X line of FIG. 8.

FIG. 8 shows a structure of a first embodiment. FIG. 9 is a sectional view taken along IX-IX line of FIG. 8, and FIG. 10 is a sectional view taken along X-X line of FIG. B.

Semiconductor substrate 1 is, for example, a silicon substrate. Fin type stacked layer structure 9 is formed on semiconductor substrate 1.

In the present example, fin type stacked layer structure 9 is a stacked layer structure in which first insulating layer 2, first semiconductor layer 3a, second insulating layer 4a, second semiconductor layer 3b, third insulating layer 4b, third semiconductor layer 3c and a fourth insulating layer 5 are stacked in order in a first direction perpendicular to the surface of semiconductor substrate 1, and the structure extends in a second direction parallel to the surface of semiconductor substrate 1.

However, the present invention is not limited to this example, and fin type stacked layer structure 9 can be generalized as a stacked layer structure in which the first insulating layer, the first semiconductor layer, ... the n-th insulating layer, the n-th semiconductor layer, and the (n+1)-th insulating layer (n is a natural number equal to or more than 2) are stacked in order.

First insulating layer 2 is made of, for example, silicon oxide ($SiO_2$). First to third semiconductor layers 3 (3a, 3b and 3c) are made of, for example, monocrystalline silicon (Si). First to third semiconductor layers 3 (3a, 3b, and 3c) are preferably monocrystalline, but may be amorphous or polycrystalline.

Second and third insulating layers 4 (4a and 4b) are made of, for example, silicon oxide ($SiO_2$). Fourth insulating layer 5 is made of, for example, silicon oxide ($SiO_2$), silicon nitride ($SiN_x$), a structure in which these materials are stacked, or the like.

First to third memory strings Na, Nb, and Nc use first to third semiconductor layers 3 (3a, 3b, and 3c) as channels. Here, one memory string uses one semiconductor layer as the channel. Therefore, the increasing of the number of the semiconductor layers constituting fin type stacked layer structure 9 and the increasing of the number of the memory strings are suitable for higher integration.

First to third memory strings Na, Nb, and Nc have a stacked layer structure of charge storage layer 6b and control gate electrode 6d extending across first to third semiconductor layers 3 (3a, 3b, and 3c) in the first direction.

First gate insulating layer 6a is formed between first to third semiconductor layers 3 (3a, 3b, and 3c) and charge storage layer 6b. Second gate insulating layer 6c is formed between charge storage layer 6b and control gate electrode 6d.

In this example, first to third memory strings Na, Nb, and Nc have a silicon/oxide/nitride/oxide/silicon (SONOS) type. That is, charge storage layer 6b is constituted of an insulator such as silicon-rich SiN. Second gate insulating layer 6c has a function of blocking a leak current between charge storage layer 6b and control gate electrode 6d, and hence is called a block insulating layer.

In the present example, first to third memory strings Na, Nb, and Nc cover two opposite side surfaces of each of first to third semiconductor layers 3 (3a, 3b, and 3c) in a third direction. That is, first to third memory strings Na, Nb, and Nc have a double gate structure.

Metal silicide layer 23 is formed by bringing a combining semiconductor layer to a silicide, and combines first to third semiconductor layers 3 (3a, 3b, and 3c) with one another at one end of each of first to third memory strings Na, Nb, and Nc in the second direction (one end on the side of drain electrode 7).

Metal silicide layer 23 is formed by bringing, for example, the combining semiconductor layer (Si) to the silicide, and is integrated with first to third semiconductor layers 3 (3a, 3b, and 3c). Moreover, the combining semiconductor layer before brought to a silicide is preferably monocrystalline, but may be polycrystalline, similarly to first to third semiconductor layers 3 (3a, 3b, and 3c).

In the present example, a region where the semiconductor layer has the silicide is shown by hatching. That is, the semiconductor layers brought to the silicide are respectively present at both ends of each of first to third memory strings Na, Nb, and Nc in the second direction.

Drain electrode 7 is connected to metal silicide layer (combining semiconductor layer) 23, and source electrode 8 is connected to the region brought to the silicide in first to third semiconductor layers 3 (3a, 3b, and 3c) at the other end of each of first to third memory strings Na, Nb, and Nc in the second direction. Bottom portions of drain electrode 7 and source electrode 8 preferably reach first insulating layer 2.

Bit line BL is connected to drain electrode 7, and source line SL is connected to source electrode 8.

First to third layer select transistors Ta, Tb, and Tc are arranged in order from the drain electrode 7 side toward first to third memory strings Na, Nb, and Nc, between first to third memory strings Na, Nb, and Nc and drain electrode 7. The number of the layer select transistors is equal to the number of the semiconductor layers constituting fin type stacked layer structure 9.

First to third layer select transistors Ta, Tb, and Tc have first to third select gate electrodes 10 (10a, 10b, and 10c) extending across first to third semiconductor layers 3 (3a, 3b, and 3c) in the first direction.

In the present example, first to third select gate electrodes 10 (10a, 10b, and 10c) cover two opposite side surfaces of each of first to third semiconductor layers 3 (3a, 3b, and 3c) in the third direction. That is, first to third layer select transistors Ta, Tb, and Tc have a double gate structure.

Source-side select transistor Ts is disposed between first to third memory strings Na, Nb, and Nc and source electrode 8.

Source-side select transistor Ts has select gate electrode 11 extending across first to third semiconductor layers 3 (3a, 3b, and 3c) in the first direction.

In the present example, source-side select gate electrode 11 covers two opposite side surfaces of each of first to third semiconductor layers 3 (3a, 3b, and 3c) in the third direction. That is, source-side select transistor Ts has a double gate structure.

There are not any special restrictions on structures of first to third layer select transistors Ta, Tb, and Tc and source-side select transistor Ts, as long as the transistors function as switch elements.

For example, first to third layer select transistors Ta, Tb, and Tc and source-side select transistor Ts may have the same structure as in memory cells constituting first to third memory strings Na, Nb, and Nc, respectively, or may have a different structure.

The positions of the edges of second and third insulating layers 4 (4a and 4b) on the side of drain electrode 7 are described.

The edge of second insulating layer 4a on the side of drain electrode 7 is located at the same position as the edge of first select gate electrode 10a on the side of first to third memory strings Na, Nb, and Nc, or located closer to drain electrode 7 than this edge.

For example, the edge of second insulating layer 4a on the side of drain electrode 7 is located at point a, or located closer to drain electrode 7 than this point.

The edge of third insulating layer 4b on the side of drain electrode 7 is located at the same position as the edge of second select gate electrode 10b on the side of first to third memory strings Na, Nb, and Nc, or located closer to drain electrode 7 than this edge.

For example, the edge of third insulating layer 4b on the side of drain electrode 7 is located at point b, or located closer to drain electrode 7 than this point.

To generalize the above, when fin type stacked layer structure 9 is a stacked layer structure in which the first insulating layer, the first semiconductor layer, ... the n-th insulating layer, the n-th semiconductor layer, and the (n+1)-th insulating layer (n is a natural number equal to or more than 2) are stacked in order, the edge of the i-th insulating layer (i is one of 2 to n) among the first to (n+1)-th insulating layers on the drain electrode side is located at the same position as the edge of the (i−1)-th select gate electrode on the side of the first to n-th memory strings, or located closer to the drain electrode than this edge.

Additionally, the edge of the i-th insulating layer on the side of the drain electrode is preferably located closer to the drain electrode than the edge of the (i+1)-th insulating layer on the side of the drain electrode. In this case, the edges of the first to (n+1)-th insulating layers on the side of the drain electrode are stepped.

Moreover, the edge of the (i+1)-th insulating layer among the first to (n+1)-th insulating layers on the side of the drain electrode is preferably located at the same position as the edge of the (i−1)-th select gate electrode on the side of the first to n-th memory strings, or located closer to the first to n-th memory strings than this edge. This is, for example, because ion implantation to form normally-on channels (metal silicide channels) 13a, 13b, and 13c is performed only once.

Furthermore, there are not any special restrictions on the position of the edge of the (n+1)-th insulating layer which is the uppermost layer on the side of the drain electrode. This is because on the (n+1)-th insulating layer, i.e., fourth insulating layer 5 in FIG. 8 to FIG. 10, the semiconductor layer (the memory string) as an active area is not formed.

The threshold states of first to third layer select transistors Ta, Tb, and Tc are described.

First layer select transistor Ta farthest from first to third memory strings Na, Nb, and Nc is always on (normally on) and cannot be controlled to be on and off in lowermost first semiconductor layer 3a within a range of a voltage applied to first select gate electrode 10a.

Here, the transistor can be always on when normally-on channel (metal silicide channel) 13a is provided in first semiconductor layer 3a serving as the channel of first layer select transistor Ta.

In other second and third semiconductor layers 3b and 3c, the on/off of first layer select transistor Ta can be controlled within the range of the voltage applied to first select gate electrode 10a.

Second layer select transistor Tb is always on (normally on) and cannot be controlled to be on and off in intermediate second semiconductor layer 3b within the range of the voltage applied to second select gate electrode 10b.

Here, the transistor can be always on when normally-on channel (metal silicide channel) 13b is provided in second semiconductor layer 3b serving as the channel of second layer select transistor Tb.

In other first and third semiconductor layers 3a and 3c, the on/off of second layer select transistor Tb can be controlled within the range of the voltage applied to second select gate electrode 10b.

Third layer select transistor Tc closest to first to third memory strings Na, Nb, and Nc is always on (normally on) and cannot be controlled to be on and off in uppermost third semiconductor layer 3c within the range of the voltage applied to third select gate electrode 10c.

Here, the transistor can be always on when normally-on channel (metal silicide channel) 13c is provided in third semiconductor layer 3c serving as the channel of third layer select transistor Tc.

In other first and second semiconductor layers 3a and 3b, the on/off of third layer select transistor Tc can be controlled within the range of the voltage applied to third select gate electrode 10c.

To generalize the above, when fin type stacked layer structure 9 is a stacked layer structure in which the first insulating layer, the first semiconductor layer, . . . the n-th insulating layer, the n-th semiconductor layer, and the (n+1)-th insulating layer (n is a natural number equal to or more than 2) are stacked in order, the j-th layer select transistor (j is one of 1 to n) among the first to n-th layer select transistors is always on (normally on) in the j-th semiconductor layer.

Moreover, the normally-on channel for producing the normally-on state is realized by the above-mentioned principle (the nanowire semiconductor and the doping of the impurity to amorphize the semiconductor).

According to such a structure, for example, when first layer select transistor Ta is switched off in second and third memory strings Nb and Nc and all first to third layer select transistors Ta, Tb, and Tc are switched on in first memory string Na, a current can be passed only through first memory string Na.

At this time, a leak path from first memory string Na to second and third memory strings Nb and Nc is blocked by second insulating layer 4a.

Similarly, for example, when second layer select transistor Tb is switched off in first and third memory strings Na and Nc and all first to third layer select transistors Ta, Tb, and Tc are switched on in second memory string Nb, a current can be passed only through second memory string Nb.

At this time, a leak path from second memory string Nb to third memory string Nc is blocked by third insulating layer 4b.

Additionally, in the above-mentioned structure, fin type stacked layer structure 9 comprises memory cells (memory strings) stacked in the first direction and connected in series in the second direction, but a constitution of a memory cell array region is not limited to this example.

For example, the memory cells in the memory cell array region can be FETs each of which has a recording layer and a control gate electrode. The memory cells use first to third semiconductor layers 3 (3a, 3b, and 3c) as the channels, and threshold values thereof change in accordance with a state of each recording layer. The recording layer constituting each of the memory cells is, for example, a charge storage layer (a floating gate electrode, a charge trap insulating layer, or the like), or a variable resistance layer (a material layer whose resistance value changes in accordance with a voltage, a current, heat, or the like).

Moreover, metal silicide layer 23 preferably includes at least one of Ni, V, Cr, Mn, Y, Mo, Ru, Rh, Hf, Ta, W, Ir, Co, Ti, Er, Pt, Pd, Zr, Gd, Dy and Ho.

B. Material Examples

Materials best suited to the generations of semiconductor memories can be properly selected as the materials that constitute the elements of the device structure shown in FIG. 8 to FIG. 10.

For example, first gate insulating layer 6a can be made of $SiO_2$, charge storage layer 6b can be made of $Si_3N_4$, second gate insulating layer 6c can be made of $Al_2O_3$, and control gate electrode 6d can be made of NiSi.

First gate insulating layer 6a may be silicon oxynitride, a stacked layer structure of silicon oxide and silicon nitride, or the like. Moreover, first gate insulating layer 6a may include silicon nanoparticles, metal ions, or the like.

Charge storage layer 6b can be made of at least one of the materials selected from the group consisting of $Si_xN_y$ having any composition ratio x, y of silicon and nitrogen, silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), and lanthanum aluminate ($LaAlO_3$).

Charge storage layer 6b may be made of impurity-added polysilicon or a conductor such as a metal.

Second gate insulating layer 6c can be made of at least one of the materials selected from the group consisting of silicon oxide ($SiO_2$), silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), lanthanum aluminate ($LaAlO_3$), and lanthanum aluminum silicate (LaAlSiO).

Control gate electrode 6d can be made of a metal compound such as tantalum nitride (TaN), tantalum carbide (TaC), or titanium nitride (TiN), or an electrically conductive metallic material such as V, Cr, Mn, Y, Mo, Ru, Rh, Hf, Ta, W, Ir, Co, Ti, Er, Pt, Pd, Zr, Gd, Dy, Ho, and Er and silicides of these substances.

Control gate electrode 6d may be made of impurity-added polysilicon.

Examples of an impurity for beforehand doping a region which becomes the normally-on channel to form normally-on channels (metal silicide channels) 13a, 13b, and 13c include arsenic (As), phosphorus (P), silicon (Si), germanium (Ge), fluorine (F), and carbon (C).

Moreover, drain electrode 7 and source electrode 8 are made of a metal material such as W or Al.

C. Operation

An example of the operation of the semiconductor memory device according to the first embodiment (FIG. 8 to FIG. 10) is described.

An example of write operation is as follows.

First, when writing is performed in memory string Na using first semiconductor layer 3a as the channel, a ground potential is applied to drain electrode 7 and source electrode 8, and a first positive bias is applied to select gate electrodes 10b and 10c and control gate electrode 6d. Any biases are not applied to select gate electrodes 10a and 11.

At the same time, for example, n-type impurity storage regions are formed in first to third layer select transistors Ta, Tb, and Tc, and first to third semiconductor layers 3 (3a, 3b, and 3c) serving as channels of first to third memory strings Na, Nb, and Nc.

Moreover, since any biases are not applied to select gate electrode 10a, first layer select transistor Ta is off in second and third semiconductor layers 3b and 3c, and is on in first semiconductor layer 3a through a normally-on channel 13a. Moreover, since any biases are not applied to select gate electrode 11, source-side select transistor Ts is off in first to third semiconductor layers 3 (3a, 3b, and 3c).

Afterward, for example, a second positive bias higher than the first positive bias is applied to a control gate electrode of the selected memory cell targeted for writing, and program data "0"/"1" is transferred to drain electrode 7 through bit line BL.

In second and third semiconductor layers 3b and 3c provided with unselected memory strings Nb and Nc, the channel potential is increased by capacitive coupling resulting from the application of the second positive bias. Therefore, a voltage high enough for writing is not applied across the control gate electrode (or the charge storage layer) and the channel, and writing is inhibited accordingly.

In first semiconductor layer 3a provided with selected memory string Na, first layer select transistor Ta is on, so that program data "0"/"1" is transferred to first semiconductor layer 3a as the channel.

When the program data is "0", for example, first semiconductor layer 3a as the channel has a positive potential. In this condition, if the second positive bias is applied to the control gate electrode of the selected memory cell, first layer select transistor Ta is cut off when the channel potential is slightly increased by the capacitive coupling.

Therefore, in first semiconductor layer 3a, the channel potential is increased by the capacitive coupling resulting from the application of the second positive bias. That is, a voltage high enough for writing is not applied across the control gate electrode (or the charge storage layer) and the channel, and any electrons are not injected into the charge storage layer. Therefore, writing is inhibited ("0"-programming).

In contrast, when the program data is "1", for example, first semiconductor layer 3a as the channel has a ground potential. In this condition, even if the second positive bias is applied to the control gate electrode of the selected memory cell, first layer select transistor Ta is not cut off.

Therefore, the ground potential is applied to first semiconductor layer 3a as the channel, and the second positive bias is applied to the control gate electrode. That is, a voltage high enough for writing is generated across the control gate electrode (or the charge storage layer) and the channel, and the electrons are injected into the charge storage layer. Therefore, writing is performed ("1"-programming).

Next, when writing is performed in memory string Nb using second semiconductor layer 3b as the channel, the ground potential is applied to drain electrode 7 and source electrode 8, and the first positive bias is applied to select gate electrodes 10a and 10c and control gate electrode 6d. Any biases are not applied to select gate electrodes 10b and 11.

At the same time, n-type impurity storage regions are formed in first to third layer select transistors Ta, Tb, and Tc, and first to third semiconductor layers 3 (3a, 3b, and 3c) serving as channels of first to third memory strings Na, Nb, and Nc.

Moreover, since any biases are not applied to select gate electrode 10a, second layer select transistor Tb is off in first and third semiconductor layers 3a and 3c, and is on in second semiconductor layer 3b through normally-on channel 13b. Moreover, since any biases are not applied to select gate electrode 11, source-side select transistor Ts is off in first to third semiconductor layers 3 (3a, 3b, and 3c).

Afterward, for example, the second positive bias higher than the first positive bias is applied to the control gate electrode of the selected memory cell targeted for writing, and program data "0"/"1" is transferred to drain electrode 7 through bit line BL.

In first and third semiconductor layers 3a and 3c provided with unselected memory strings Na and Nc, the channel potential is increased by the capacitive coupling resulting from the application of the second positive bias. Therefore, the voltage high enough for writing is not applied across the control gate electrode (or the charge storage layer) and the channel, and writing is inhibited accordingly.

In second semiconductor layer 3b provided with selected memory string Nb, second layer select transistor Tb is on, so that program data "0"/"1" is transferred to second semiconductor layer 3b serving as the channel.

When the program data is "0", for example, second semiconductor layer 3b as the channel has a positive potential. In this condition, if the second positive bias is applied to the control gate electrode of the selected memory cell, second layer select transistor Tb is cut off when the channel potential is slightly increased by the capacitive coupling.

Therefore, in second semiconductor layer 3*b*, the channel potential is increased by the capacitive coupling resulting from the application of the second positive bias. That is, the voltage high enough for writing is not applied across the control gate electrode (or the charge storage layer) and the channel, and any electrons are not injected into the charge storage layer. Therefore, writing is inhibited ("0"-programming).

In contrast, when the program data is "1", for example, second semiconductor layer 3*b* as the channel has a ground potential. In this condition, even if the second positive bias is applied to the control gate electrode of the selected memory cell, second layer select transistor Tb is still on.

Therefore, the ground potential is applied to second semiconductor layer 3*b* as the channel, and the second positive bias is applied to the control gate electrode. That is, the voltage high enough for writing is generated across the control gate electrode (or the charge storage layer) and the channel, and the electrons are injected into the charge storage layer. Therefore, writing is performed ("1"-programming).

Finally, when writing is performed in memory string Nc using third semiconductor layer 3*c* as the channel, the ground potential is applied to drain electrode 7 and source electrode 8, and the first positive bias is applied to select gate electrodes 10*a* and 10*b* and control gate electrode 6*d*. Any biases are not applied to select gate electrodes 10*c* and 11.

At the same time, for example, n-type impurity storage regions are formed in first to third layer select transistors Ta, Tb, and Tc, and first to third semiconductor layers 3 (3*a*, 3*b*, and 3*c*) serving as the channels of first to third memory strings Na, Nb, and Nc.

Moreover, since any biases are not applied to select gate electrode 10*c*, third layer select transistor Tc is off in first and second semiconductor layers 3*a* and 3*b*, and is on in third semiconductor layer 3*c* through impurity region 13*c*. Moreover, since any biases are not applied to select gate electrode 11, source-side select transistor Ts is off in first to third semiconductor layers 3 (3*a*, 3*b*, and 3*c*).

Afterward, for example, the second positive bias higher than the first positive bias is applied to the control gate electrode of the selected memory cell targeted for writing, and program data "0"/"1" is transferred to drain electrode 7 through bit line BL.

In first and second semiconductor layers 3*a* and 3*b* provided with unselected memory strings Na and Nb, the channel potential is increased by the capacitive coupling resulting from the application of a third bias. Therefore, the voltage high enough for writing is not applied across the control gate electrode (or the charge storage layer) and the channel, and writing is inhibited accordingly.

In third semiconductor layer 3*c* provided with selected memory string Nc, third layer select transistor Tc is on, so that program data "0"/"1" is transferred to third semiconductor layer 3*c* as the channel.

When the program data is "0", for example, third semiconductor layer 3*c* as the channel has a positive potential. In this condition, if the second positive bias is applied to the control gate electrode of the selected memory cell, third layer select transistor Tc is cut off when the channel potential is slightly increased by the capacitive coupling.

Therefore, in third semiconductor layer 3*c*, the channel potential is increased by the capacitive coupling resulting from the application of the second positive bias. That is, the voltage high enough for writing is not applied across the control gate electrode (or the charge storage layer) and the channel, and any electrons are not injected into the charge storage layer. Therefore, writing is inhibited ("0"-programming).

In contrast, when the program data is "1", for example, third semiconductor layer 3*c* as the channel has a ground potential. In this condition, even if the second positive bias is applied to the control gate electrode of the selected memory cell, third layer select transistor Tc is still on.

Therefore, the ground potential is applied to third semiconductor layer 3*c* as the channel, and the second positive bias is applied to the control gate electrode. That is, the voltage high enough for writing is generated across the control gate electrode (or the charge storage layer) and the channel, and the electrons are injected into the charge storage layer. Therefore, writing is performed ("1"-programming).

Examples of erase operation are as follows.

First Example

The erase operation is simultaneously performed in, for example, first to third memory strings Na, Nb, and Nc in the fin type stacked layer structure (block erase 1).

First, a ground potential is applied to drain electrode 7 and source electrode 8, and a first negative bias is applied to select gate electrodes 10*a*, 10*b*, 10*c*, and 11 and control gate electrode 6*d*.

At the same time, p-type impurity storage regions are formed in first to third layer select transistors Ta, Tb, and Tc and first to third semiconductor layers 3 (3*a*, 3*b*, and 3*c*) serving as channels of first to third memory strings Na, Nb, and Nc.

Then, a second negative bias higher than the first negative bias is applied to control gate electrode 6*d*.

As a result, a voltage high enough for erasing is generated across the control gate electrode (or the charge storage layer) and the channel, and electrons in the charge storage layer are discharged to the channel. Thus, erasing is performed (block erase).

Second Example

The erase operation is performed in, for example, one of first to third memory strings Na, Nb, and Nc in the fin type stacked layer structure (block erase 2).

For example, when erasing is performed in first memory string Na, any biases are not applied to select gate electrodes 10*a* and 11, similarly to the writing. In consequence, first layer select transistor Ta is off in second and third semiconductor layers 3*b* and 3*c*, and hence erasing can selectively be performed in first memory string Na.

Moreover, when erasing is performed in second memory string Nb, any biases are not applied to select gate electrodes 10*b* and 11, similarly to the writing. In consequence, second layer select transistor Tb is off in first and third semiconductor layers 3*a* and 3*c*, and hence erasing can selectively be performed in second memory string Nb.

Furthermore, when erasing is performed in third memory string Nc, any biases are not applied to select gate electrodes 10*c* and 11, similarly to the writing. In consequence, third layer select transistor Tc is off in first and second semiconductor layers 3*a* and 3*b*, and hence erasing can selectively be performed in third memory string Nc.

Third Example

The erase operation can be performed in, for example, memory cells in one of first to third memory strings Na, Nb, and Nc in the fin type stacked layer structure (page erase/one cell erase).

In this case, the following conditions are further added to the conditions of the above first or second example.

A second negative bias higher than a first negative bias is applied to a control gate electrode of a selected memory cell targeted for erasing, and the second negative bias is not applied to a control gate electrode of an unselected memory cell which is not targeted for erasing.

In consequence, only for the selected memory cell, a voltage high enough for erasing is generated across the control gate electrode (or the charge storage layer) and a channel, and electrons in the charge storage layer are discharged to the channel. Therefore, erasing is performed.

An example of read operation is as follows.

First, when reading is performed in memory string Na using first semiconductor layer 3a as a channel, drain electrode 7 is connected to a reading circuit, and a ground potential is applied to source electrode 8. Moreover, a first positive bias is applied to select gate electrodes 10b, 10c, and 11 and control gate electrode 6d.

The first positive bias has a value that switches on the memory cell, for example, regardless of whether data is "0" or "1". Any biases are not applied to select gate electrode 10a.

At this time, any biases are not applied to select gate electrode 10a. Therefore, first layer select transistor Ta is off in second and third semiconductor layers 3b and 3c, and is on in first semiconductor layer 3a.

Afterward, data is sequentially read in memory string Na from the memory cells on the source region side to the memory cells on the drain region side.

In the selected memory cell targeted for reading, for example, a second positive bias for reading lower than the first positive bias is applied to the control gate electrode. The second positive bias has, for example, a value between the threshold of the "0"-data and the threshold of the "1"-data.

Therefore, whether to switch on or off the selected memory cell is determined by the value of the data stored in the selected memory cell, so that reading can be performed using the reading circuit to detect potential changes in bit lines BL and changes in currents running through the bit lines.

Next, when reading is performed in memory string Nb using second semiconductor layer 3b as a channel, drain electrode 7 is connected to the reading circuit, and the ground potential is applied to source electrode 8. Moreover, the first positive bias is applied to select gate electrodes 10a, 10c, and 11 and control gate electrode 6d.

The first positive bias has a value that switches on the memory cell, for example, regardless of whether data is "0" or "1". Any biases are not applied to select gate electrode 10b.

At the same time, any biases are not applied to select gate electrode 10b. Therefore, second layer select transistor Tb is off in first and third semiconductor layers 3a and 3c, and is on in second semiconductor layer 3b.

Afterward, data is sequentially read in memory string Nb from the memory cells on the source region side to the memory cells on the drain region side.

In the selected memory cell targeted for reading, for example, the second positive bias for reading lower than the first positive bias is applied to the control gate electrode. The second positive bias has, for example, a value between the threshold of the "0"-data and the threshold of the "1"-data.

Therefore, whether to switch on or off the selected memory cell is determined by the value of the data stored in the selected memory cell, so that reading can be performed using the reading circuit to detect potential changes in bit lines BL and changes in currents running through the bit lines.

Finally, when reading is performed in memory string Nc using third semiconductor layer 3c as a channel, drain electrode 7 is connected to the reading circuit, and the ground potential is applied to source electrode 8. Moreover, the first positive bias is applied to select gate electrodes 10a, 10b, and 11 and control gate electrode 6d.

The first positive bias has a value that switches on the memory cell, for example, regardless of whether data is "0" or "1". Any biases are not applied to select gate electrode 10c.

At the same time, any biases are not applied to select gate electrode 10c. Therefore, third layer select transistor Tc is off in first and second semiconductor layers 3a and 3b, and is on in third semiconductor layer 3c.

Afterward, data is sequentially read in memory string Nc from the memory cells on the source region side to the memory cells on the drain region side.

In the selected memory cell targeted for reading, for example, the second positive bias for reading lower than the first positive bias is applied to the control gate electrode. The second positive bias has, for example, a value between the threshold of the "0"-data and the threshold of the "1"-data.

Therefore, whether to switch on or off the selected memory cell is determined by the value of the data stored in the selected memory cell, so that reading can be performed using the reading circuit to detect potential changes in bit lines BL and changes in currents running through the bit lines.

D. Method of Manufacturing the Structure Shown in FIG. 8 to FIG. 10

FIG. 11 to FIG. 20 show a method of manufacturing the structure shown in FIG. 8 to FIG. 10.

Figure 11:
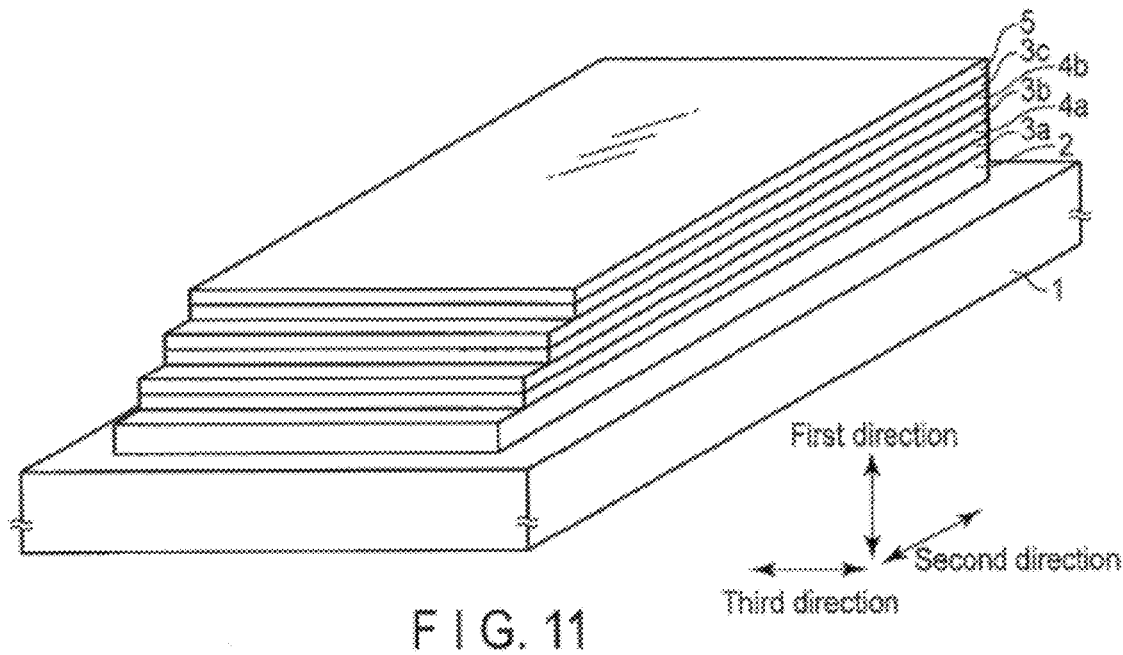

First, as shown in FIG. 11, first-conductivity-type (e.g., p-type) semiconductor substrate (e.g., silicon) 1 having, for example, a plane direction (100) and a specific resistance of 10 to 20 Ωcm is prepared. On this semiconductor substrate 1, first insulating layer (e.g., silicon oxide) 2 is formed. Continuously, on first insulating layer 2, first semiconductor layer (e.g., silicon) 3a and second insulating layer (e.g., silicon oxide) 4a are successively formed.

A resist pattern is formed on second insulating layer 4a by a photo engraving process (PEP). RIE is performed using this resist pattern as a mask, thereby patterning second insulating layer 4a and first semiconductor layer 3a. In consequence, a position of an edge of second insulating layer 4a in a second direction is determined. The resist pattern is removed afterwards.

Moreover, on second insulating layer 4a, second semiconductor layer (e.g., silicon) 3b and third insulating layer (e.g., silicon oxide) 4b are successively formed.

A resist pattern is formed on third insulating layer 4b by the PEP. RIE is performed using this resist pattern as a mask, thereby patterning third insulating layer 4b and second semiconductor layer 3b. In consequence, the position of the edge of third insulating layer 4b in the second direction is determined. The resist pattern is removed afterwards.

Then, third semiconductor layer (e.g., silicon) 3c and fourth insulating layer (e.g., silicon oxide) 5 are successively formed on third insulating layer 4b.

A resist pattern is formed on fourth insulating layer 5 by the PEP. The RIE is performed using this resist pattern as a mask, thereby patterning fourth insulating layer 5 and third semiconductor layer 3c. In consequence, the position of the edge of fourth insulating layer 5 in the second direction is determined. The resist pattern is removed afterwards.

Here, in the present example, thicknesses of second to fourth insulating layers 4a, 4b, and 5 in a first direction are preferably equal to one another, in consideration of ion implantation (simultaneous implantation) described later.

Figure 12:
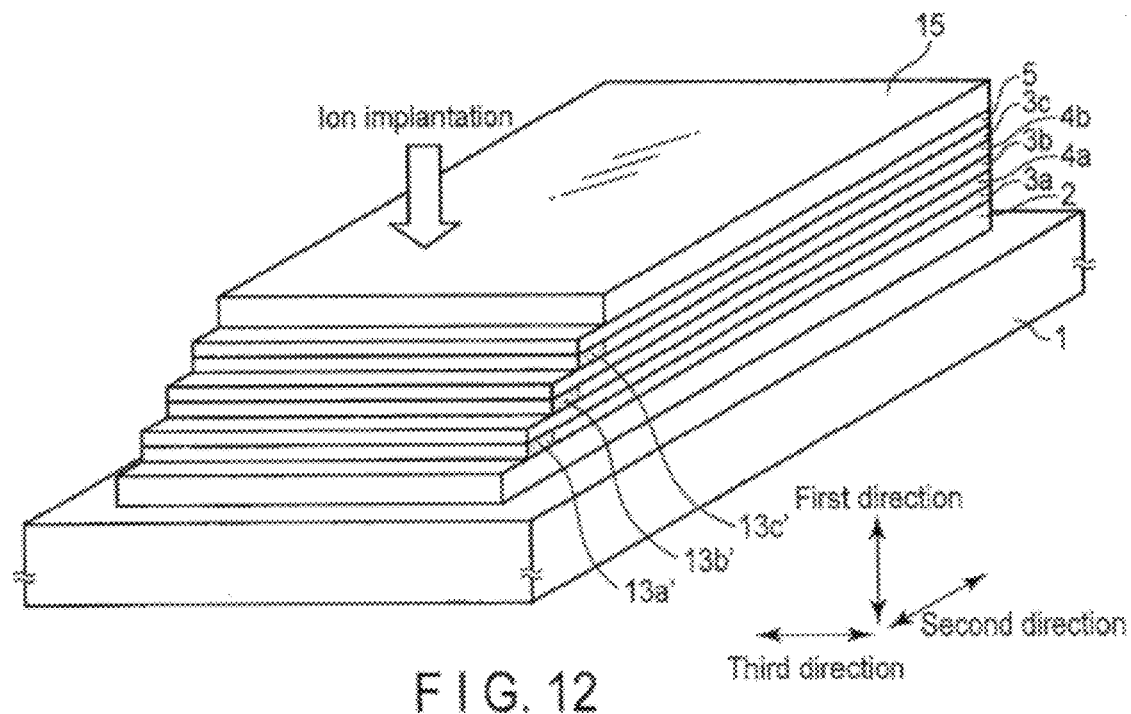

Next, as shown in FIG. 12, resist pattern 15 is formed on fourth insulating layer 5 by the PEP. Ion implantation of arsenic (As) to form a normally-on channel (the metal silicide channel) is performed using this resist pattern 15 as a mask.

In this ion implantation, when acceleration energy and dose amount are controlled, impurity regions 13a', 13b', and 13c' are simultaneously formed in first to third semiconductor layers 3 (3a, 3b, and 3c) (simultaneous implantation).

Moreover, the impurity regions 13a', 13b', and 13c' are formed only at one end of each of first to third semiconductor layers 3 (3a, 3b, and 3c) in a self alignment manner, because second to fourth insulating layers 4a, 4b, and 5 function as masks.

Resist pattern 15 is removed afterwards.

Figure 13:
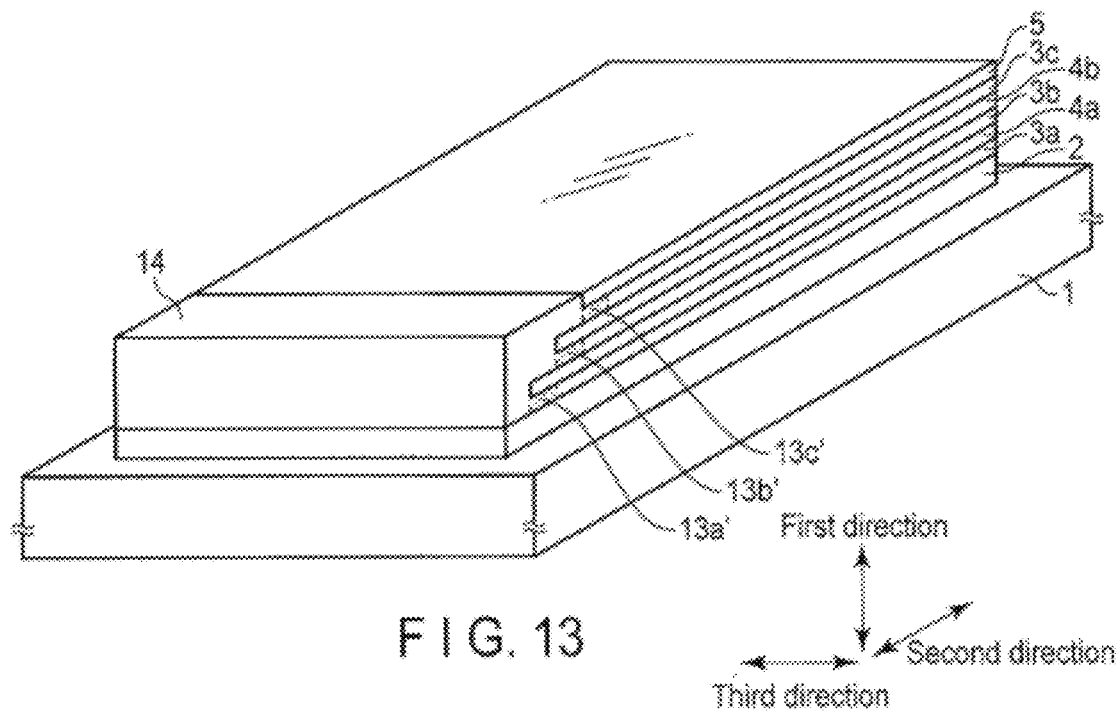

Next, as shown in FIG. 13, combining semiconductor layer (e.g., silicon) 14 is formed, and the surface of combining semiconductor layer 14 is planarized by chemical mechanical polishing (CMP). This planarizing can be performed by, for example, dry etching.

Combining semiconductor layer 14 combine first to third semiconductor layers 3 (3a, 3b, and 3c) with one another at one end in the second direction.

Figure 14:
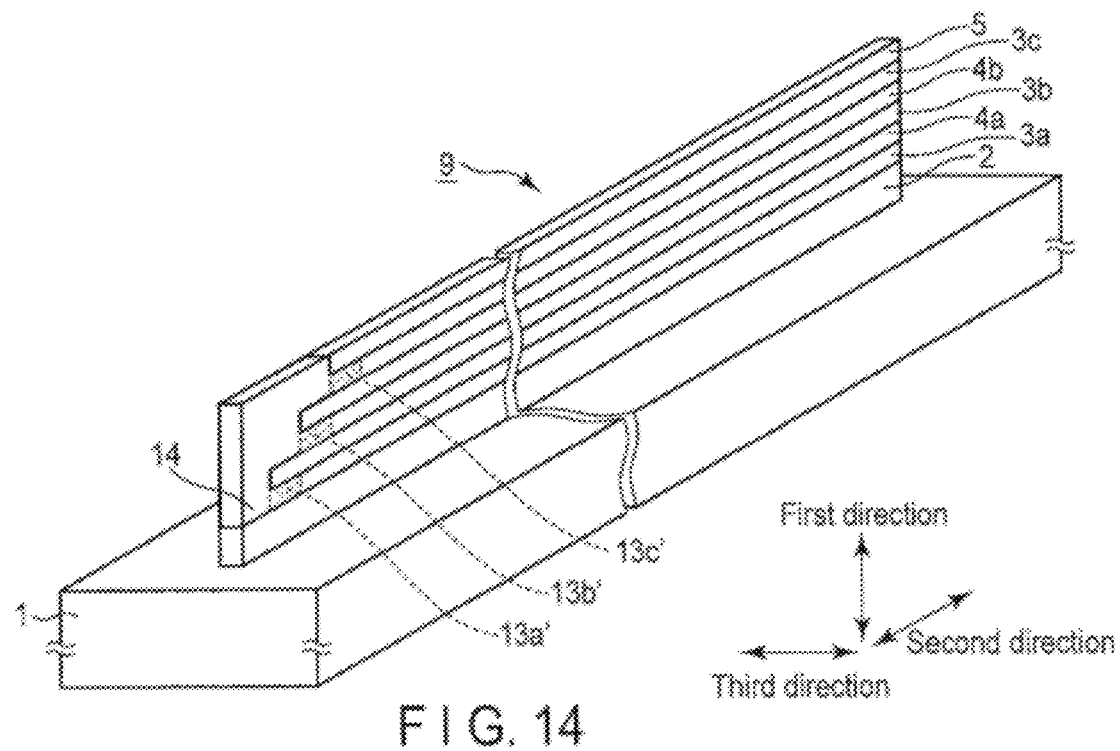

Next, as shown in FIG. 14, a resist pattern is formed on fourth insulating layer 5 and combining semiconductor layer 14 by the PEP. The RIE is performed using this resist pattern as a mask, thereby successively patterning fourth insulating layer 5, third semiconductor layer 3c, third insulating layer 4b, second semiconductor layer 3b, second insulating layer 4a, first semiconductor layer 3a, first insulating layer 2, and combining semiconductor layer 14. In consequence, fin type stacked layer structure 9 is formed.

The resist pattern is removed afterwards.

Next, as shown in FIG. 15, gate stacked layer structures 6(1), 6(2), ... 6(n) and select gate electrodes 10 (10a, 10b, and 10c) extending across fin type stacked layer structure 9 in a third direction are formed by using a method such as CVD or sputtering, and an anisotropic etching method such as the RIE.

Here, gate stacked layer structures 6(1), 6(2), ... 6(n) extend in the first direction, for example, in two opposite side surfaces of each of first to third semiconductor layers 3 (3a, 3b, and 3c) in the third direction. Similarly, select gate electrodes 10 (10a, 10b, and 10c) also extend in the first direction, for example, in two opposite side surfaces of each of first to third semiconductor layers 3 (3a, 3b, and 3c) in the third direction.

Figure 16:
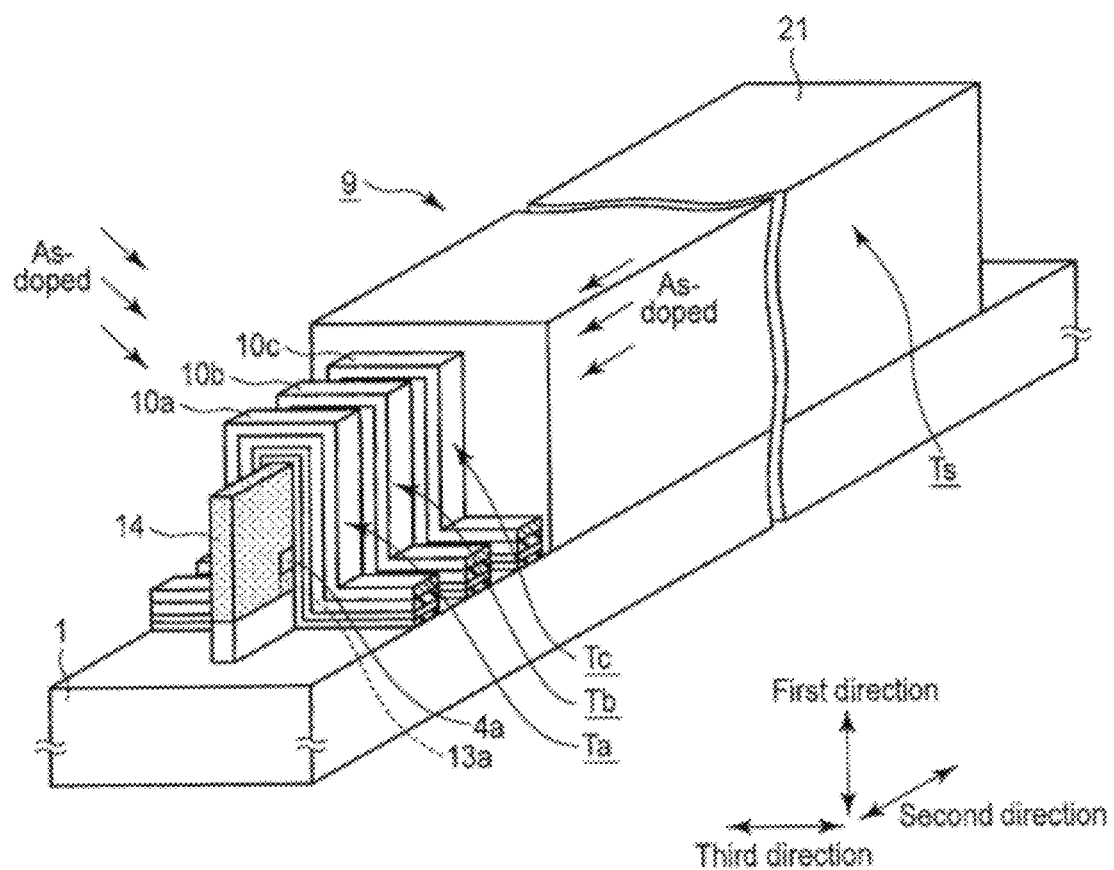
Figure 17:
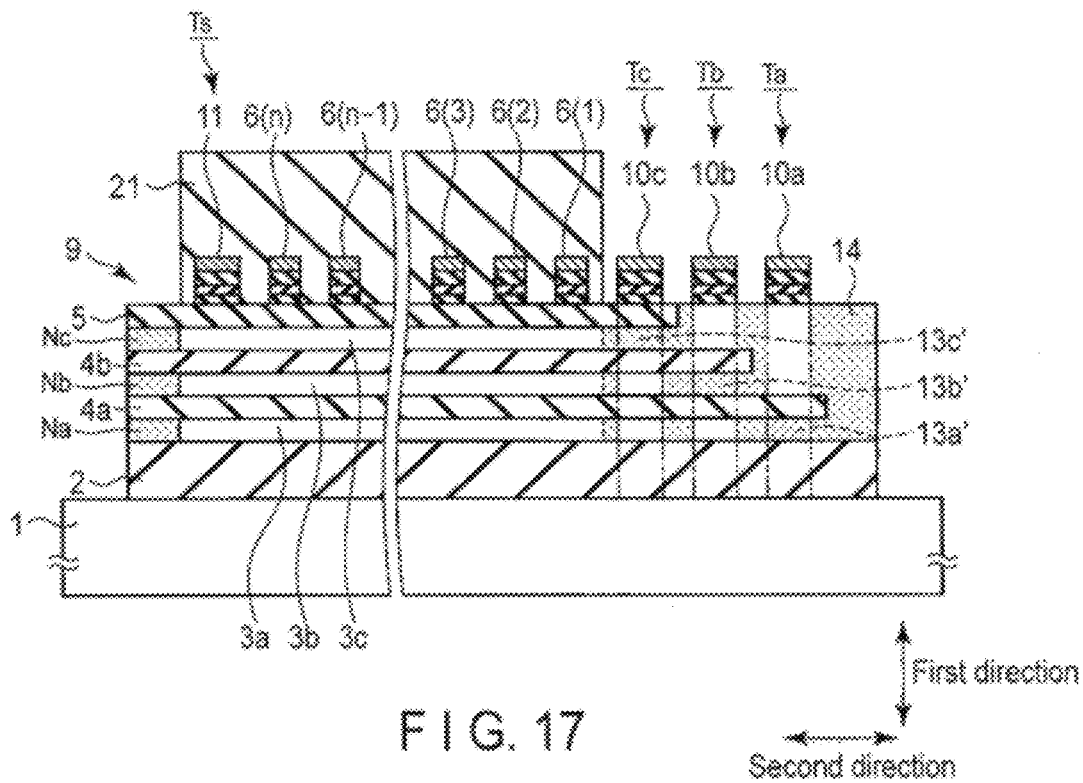

Next, as shown in FIG. 16 and FIG. 17, protective layer (e.g., silicon nitride layer) 21 is formed on fin type stacked layer structure 9, and protective layer 21 is used as a mask to perform the ion implantation of arsenic (As).

In this ion implantation, acceleration energy and dose amount are controlled, whereby an impurity region (shown by dots) is formed in a self-aligning manner in first to third semiconductor layers 3 (3a, 3b, and 3c).

In the present example, protective layer 21 covers, for example, a region provided with a memory cell array.

Thus, a reason to cover the memory cell array with protective layer 21 is that when memory cells (FETs) are miniaturized, there occurs a so-called fringe phenomenon where a diffusion layer (the source/drain region) is not formed, but a current path is formed in the channel when a voltage is applied to the gate electrode (the control gate electrode).

Conversely, when the diffusion layer is formed in the memory cells (FETs), characteristics of the memory cells deteriorate owing to the diffusion of the impurity in the channel section.

Additionally, in the fringe phenomenon, when a space between the gate electrodes (the electrode pitch) is 30 nm or smaller, the current path is formed in the semiconductor layer (the channel) by a fringe electric field from the gate electrode via the insulating layer, even if the diffusion layer is not formed between the transistors connected in series. This is described in, for example, Chang-Hyum Lee et al., VLSI Technology Digest of Technical Papers, pp. 118-119, 2008.

Owing to this ion implantation, the impurity regions (shown by dots) are formed in first to third semiconductor layers 3 (3a, 3b, and 3c) in which first to third layer select transistors Ta, Tb, and Tc are present on the side of the drain electrode, and in first to third semiconductor layers 3 (3a, 3b, and 3c) on the side of the source electrode, respectively.

Figure 18:
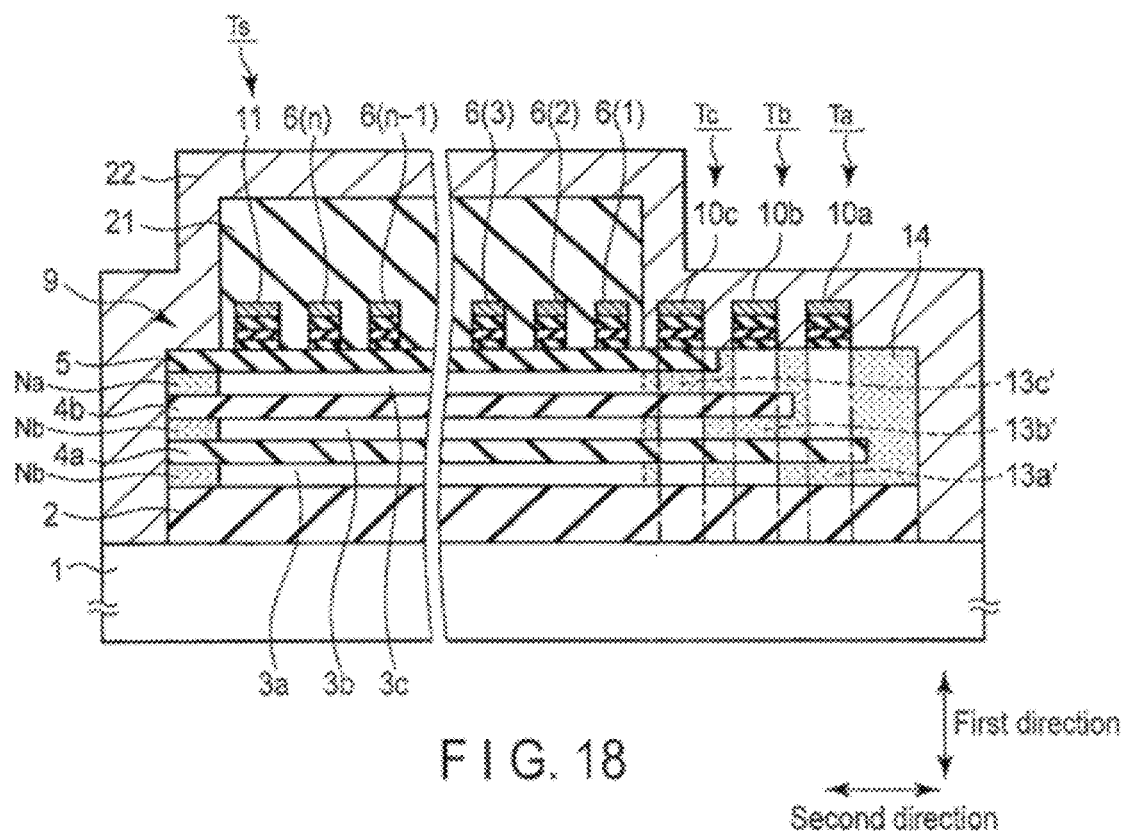

Next, as shown in FIG. 18, metal layer (e.g., Ni layer) 22 which covers fin type stacked layer structure 9 is formed by a sputtering process or a CVD process. At this time, in a region covered with protective layer 21 and select gate electrodes 10 (10a, 10b, and 10c), metal layer 22 does not come in contact with first to third semiconductor layers 3 (3a, 3b, and 3c) as shown in FIG. 19.

Moreover, in an exposed region which is not covered with protective layer 21 and select gate electrodes 10 (10a, 10b, and 10c), metal layer 22 comes in contact with first to third semiconductor layers 3 (3a, 3b, and 3c), as shown in FIG. 20.

Afterward, a heat treatment is performed to cause a silicide reaction between each of first to third semiconductor layers 3 (3a, 3b, and 3c) and metal layer 22. A heat treatment temperature is, for example, from 300 to 500° C., and a heat treatment time is, for example, from several seconds to several tens of seconds. Owing to this heat treatment, the impurity regions (shown by dots) of FIG. 18 change to metal silicide layers. Afterward, through wet etching, unreacted metal layer 22 is removed, and protective layer 21 is removed.

In consequence, as shown in FIG. 21, metal silicide layers 23 are formed at both ends of fin type stacked layer structure 9 in the second direction, respectively. Moreover, when drain electrode (e.g., tungsten) 7 is formed at one end of fin type stacked layer structure 9 in the second direction and source electrode (e.g., tungsten) 8 is formed at the other end, the structure shown in FIG. 8 to FIG. 10 is completed.

Additionally, when the normally-on channels of first to third layer select transistors Ta, Tb, and Tc are securely formed in the above manufacturing method, a channel width of each of first to third layer select transistors Ta, Tb, and Tc (corresponding to a thickness of each of first to third semiconductor layers 3a, 3b, and 3c) is preferably 15 nm or smaller.

Moreover, when the silicide reaction is caused in the whole channel section, a channel length of each of first to third layer select transistors Ta, Tb, and Tc (corresponding to a width of each of select gate electrodes 10a, 10b, and 10c) is preferably 40 nm or smaller.

E. Summary

According to the first embodiment, a normally-on channel of each layer select transistor is a metal silicide layer (e.g., a nickel silicide layer), and hence an on-resistance can be lowered as compared with when the normally-on channel is formed of an impurity region, which can contribute to a higher speed of a memory operation. This effect is remarkably exerted, when the number of active layers (memory strings) in a fin type stacked layer structure increases and the layer select transistors connected in series increase accordingly.

Moreover, an impurity is added to the channel of each normally-on transistor, to promote a silicide reaction. Therefore, characteristics (an on-resistance) of the transistor are not determined by a dope amount of the impurity. That is, the channel may be doped with a sufficient amount of the impurity to amorphize the semiconductor layer. In consequence, as compared with a conventional example where the dope amount of the impurity has to be increased, the dope amount of the impurity can be decreased, and a process time can be shortened.

Moreover, when a memory cell array region is covered with a protective layer and the silicide reaction is inhibited in the memory cell array region, a channel potential of each memory cell can easily be controlled. Therefore, write/erase characteristics can be enhanced.

Moreover, first to third semiconductor layers 3 (3a, 3b, and 3c) are generally polycrystalline, but when a heat treatment is performed, grain size of the polycrystals can be increased, whereby a polycrystalline semiconductor can be allowed to approach a monocrystalline semiconductor. When the semiconductor becomes monocrystalline, a current running through the memory cell transistors and select transistors can be increased. A reading speed can be raised. Moreover, it is possible to obtain a high-quality oxide film through thermal oxidation, as a tunnel insulating film (a silicon oxide film) of the memory cells, and hence holding characteristics of the memory cells can be enhanced.

Moreover, it is possible to use silicon, germanium, silicon germanium or the like as first to third semiconductor layers 3 (3a, 3b, and 3c). Silicon germanium and germanium have a lower crystallizing temperature than silicon, and hence crystal grain size thereof can more easily be increased through the heat treatment. Therefore, silicon germanium and germanium can obtain properties closer to monocrystalline properties than silicon, and the reading speed and holding characteristics can be enhanced.

Moreover, when fin type stacked layer structure 9 is formed, insulating layers 2, 4a, 4b, and 5 and semiconductor layers 3a, 3b, and 3c are not alternately stacked, but a process of epitaxially growing a silicon layer on a silicon germanium layer and epitaxially growing a silicon germanium layer on the silicon layer is repeated instead, to form fin type stacked layer structure 9. The silicon germanium layer may be removed through etching afterwards. In this process, the silicon layer in fin type stacked layer structure 9 becomes completely monocrystalline. Therefore, reading characteristics and the holding characteristics can be enhanced as described above.

(2) Second Embodiment

Figure 22:
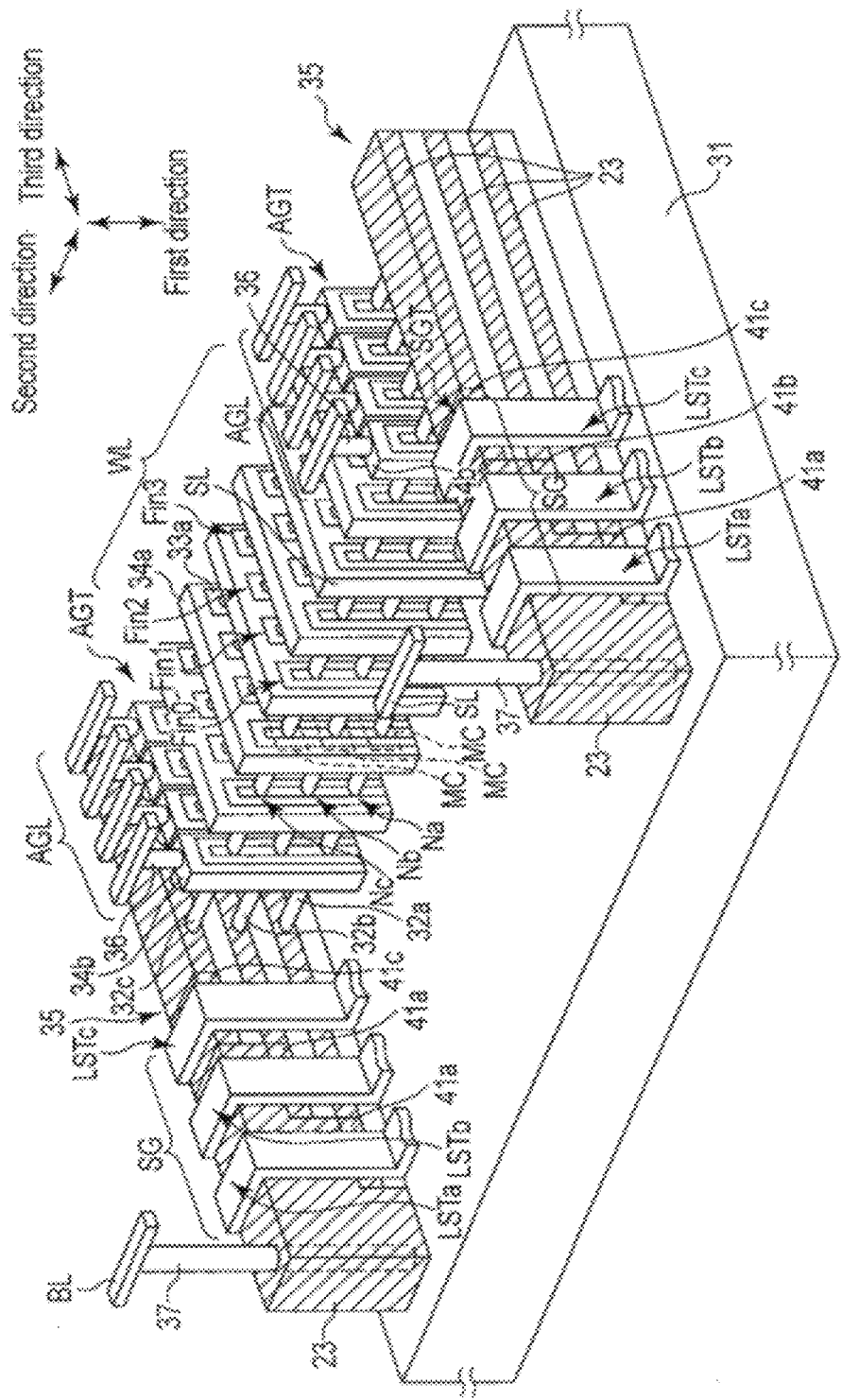
FIG. 22 is a view showing a three-dimensional memory device as a second embodiment.
Figure 25:
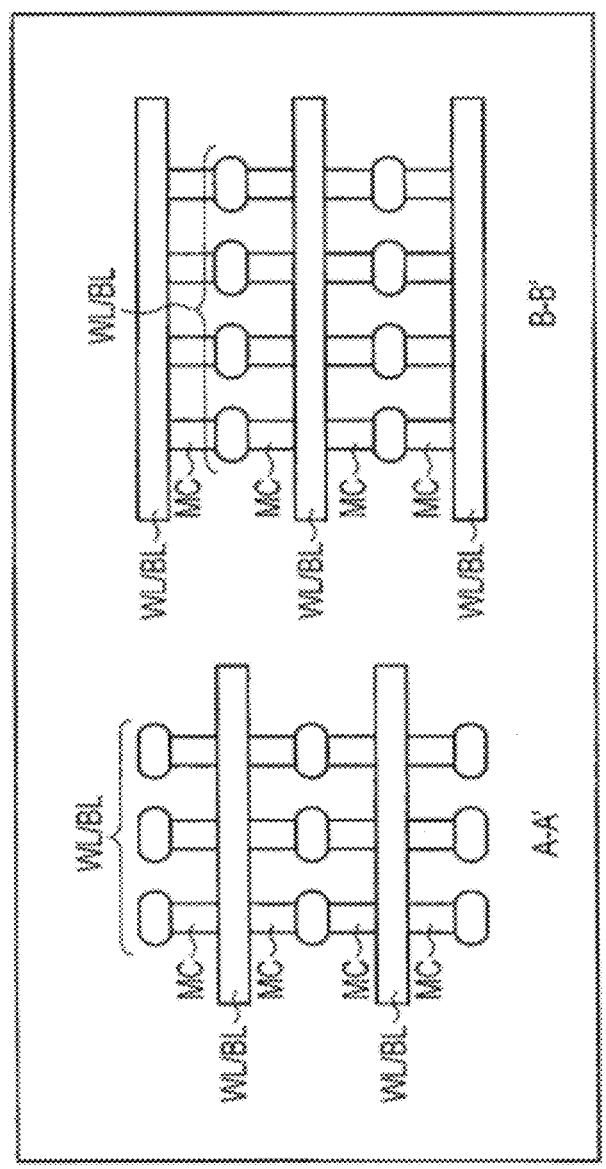
FIG. 25 is a sectional view taken along A-A' line and B-B' line of FIG. 24.

FIG. 22 shows a structure of a second embodiment.

On semiconductor substrate (e.g., Si substrate) 31, there are arranged memory strings Na, Nb, and Nc stacked in a first direction perpendicular to the surface of the substrate, and extending in a second direction parallel to the surface of semiconductor substrate ?1(31)?. In the present embodiment, the number of the memory strings stacked in the first direction is three, but the present invention is not limited to this embodiment. That is, the number of the memory strings stacked in the first direction may be two or more.

Additionally, the larger number of the memory strings stacked in the first direction is more suitable for higher capacity of a nonvolatile semiconductor memory device.

These memory strings Na, Nb, and Nc are constituted of three semiconductor layers (e.g., monocrystalline Si layers) 32a, 32b, and 32c stacked in the first direction, and memory cells MC connected in series in the second direction. In the present embodiment, the number of memory cells MC connected in series is six, but the present invention is not limited to this embodiment. That is, the number of the memory cells connected in series in the second direction may be two or more.

Additionally, the larger number of the memory cells connected in series in the second direction is more suitable for the higher capacity of the nonvolatile semiconductor memory device.

Each of memory cells MC comprises recording layer 33a disposed on the side surface of semiconductor layer 32 (32a, 32b, or 32c) in a third direction perpendicular to the first and second directions, and gate electrode (e.g., word line WL) 34a disposed on the side of recording layer 33a which is opposite to semiconductor layer 32.

Gate electrode 34a extends in the first direction on the side of the side surface of each of semiconductor layers 32a, 32b, and 32c that is located in the third direction. Moreover, when gate electrode 34a is seen from the upper surface thereof, gate electrode 34a extends across memory strings Na, Nb, and Nc in the third direction.

Both ends of each of memory strings Na, Nb, and Nc in the second direction are connected to beams 35 extending in the third direction. When semiconductor layers 32a, 32b, and 32c are separated by insulating layers and one semiconductor layer and one insulating layer are alternately stacked to form fin type stacked layer structures Fin0 to Fin3. In this case, for example, beams 35 have the same structure as in fin type stacked layer structures Fin0 to Fin3.

Beams 35 have a function of fixing memory strings Na, Nb, and Nc, and preventing, for example, the collapse of fin type stacked layer structures Fin0 to Fin3. The width of each beam 35 in the second direction is preferably greater than the width of each of fin type stacked layer structures Fin0 to Fin3 in the third direction, i.e., the width of each of semiconductor layers 32a, 32b, and 32c in the third direction.

Between each of memory strings Na, Nb, and Nc and beam 35, for example, assist gate transistor AGT is disposed to select one fin type stacked layer structure (one group comprising memory strings Na, Nb, and Nc). Assist gate transistors AGT may function as switches. Therefore, assist gate transistors AGT may have the same structure as in memory cells MC, or may have a different structure.

In the present embodiment, assist gate transistor AGT has recording layer 33b, and gate electrode (assist gate electrode) 34b, similarly to each memory cell MC. When assist gate transistors AGT are different in structure from memory cells MC, assist gate transistors AGT can be constituted of, for example, transistors having a metal-oxide-semiconductor (MOS) structure.

Gate electrodes 34b are electrically isolated from one another. Moreover, gate electrodes 34b are connected to assist gate lines AGL via contact plugs 36.

At an end of beam 35 in the third direction, a function of selecting one from memory strings Na, Nb, and Nc is added.

The function is realized by layer select transistors LSTa, LSTb, and LSTc. In this case, each semiconductor layer in beam 35 can be provided with one common bit line contact portion (plug) 37.

Layer select transistor LSTa is always on (normally on) in the lowermost semiconductor layer in beam 35, i.e., the semiconductor layer provided with one memory string Na in fin type stacked layer structures Fin0 to Fin3. Layer select transistor LSTa functions as a switch in the other semiconductor layers.

Moreover, layer select transistor LSTb is always on (normally on) in the intermediate semiconductor layer in beam 35, i.e., the semiconductor layer provided with one memory string Nb in fin type stacked layer structures Fin0 to Fin3. Layer select transistor LSTb functions as a switch in the other semiconductor layers.

Furthermore, layer select transistor LSTc is always on (normally on) in the uppermost semiconductor layer in beam 35, i.e., the semiconductor layer provided with one memory string Nc in fin type stacked layer structures Fin0 to Fin3. Layer select transistor LSTc functions as a switch in the other semiconductor layers.

The normally-on state of layer select transistors LSTa, LSTb, and LSTc is realized, for example, by selectively forming normally-on channels (metal silicide channels) 41a, 41b, and 41c in the respective semiconductor layers of beams 35.

In this case, for example, when memory string Na is selected, a potential is applied to select gate electrode SG so that layer select transistor LSTa is off and layer select transistors LSTb and LSTc are on. At this time, in the uppermost layer and the intermediate layer, layer select transistor LSTa is off, and hence memory strings Nb and Nc are not selected. In contrast, in the lowermost layer, layer select transistor LSTa is normally on, and hence memory string Na is selected.

According to a similar principle, memory strings Nb and Nc can independently be selected.

Additionally, each of layer select transistors LSTa, LSTb, and LSTc may be constituted of recording layer 33b and gate electrode 34b, similarly to memory cell MC. The transistor may be different in structure from memory cell MC instead.

When layer select transistors LSTa, LSTb, and LSTc are different in structure from memory cells MC, layer select transistors LSTa, LSTb, and LSTc can be constituted of, for example, transistors having an MOS structure.

In consequence, one of memory strings Na, Nb, and Nc (one semiconductor layer in fin type stacked layer structures Fin0 to Fin3) can be selected. That is, the respective semiconductor layers in fin type stacked layer structures Fin0 to Fin3 can independently be controlled as the channels of the memory strings.

In the present embodiment, fin type stacked layer structures Fin0 to Fin3 are arranged in the third direction. In the present embodiment, the number of fin type stacked layer structures Fin0 to Fin3 arranged in the third direction is four, but the present invention is not limited to this embodiment. That is, the number of fin type stacked layer structures Fin0 to Fin3 arranged in the third direction may be two or more.

It is to be noted that the larger number of fin type stacked layer structures Fin0 to Fin3 arranged in the third direction is suitable for the higher capacity of the nonvolatile semiconductor device.

(3) Third Embodiment

In the first and second embodiments, memory cells formed in a fin type stacked layer structure are FETs each having a recording layer and a gate electrode and using a semiconductor layer as a channel (e.g., flash memory cells each having a charge storage layer), but the present invention is not limited to these embodiments.

For example, when first and second fin type stacked layer structures are intersected with each other and two-terminal type memory cells are arranged between a semiconductor layer in the first fin type stacked layer structure and a semiconductor layer in the second fin type stacked layer structure, a cross point type memory cell array can be realized.

In this case, as the memory cells, it is possible to employ, as they are, memory cells for use in a resistance change type memory such as a resistance random access memory (ReRAM), a phase change memory (PCM), or a magnetic random access memory (MRAM).

FIG. 23 shows a structure of a third embodiment.

On a semiconductor substrate (e.g., an Si substrate), a first fin type stacked layer structure and a second fin type stacked layer structure intersecting with each other are arranged.

The first fin type stacked layer structure comprises semiconductor layers 51a, 51b, and 51c which are stacked in a first direction perpendicular to the surface of the semiconductor substrate and which extend in a second direction parallel to the surface of the semiconductor substrate.

The second fin type stacked layer structure comprises semiconductor layers 52a, 52b, and 52c which are stacked in the first direction perpendicular to the surface of the semiconductor substrate and which extend in a third direction parallel to the surface of the semiconductor substrate.

In the present embodiment, the number of semiconductor layers stacked in the first direction is three in both of the first and second fin type stacked layer structures, but the present invention is not limited to this embodiment. That is, the number of the semiconductor layers stacked in the first direction may be two or more.

Semiconductor layers 51a, 51b, and 51c in the first fin type stacked layer structure function as word lines WL or bit lines BL. Similarly, semiconductor layers 52a, 52b, and 52c in the second fin type stacked layer structure function as word lines WL or bit lines BL.

For example, as shown in FIG. 23 and FIG. 24, two-terminal type memory cells MC are arranged between semiconductor layer WL/BL (51a, 51b, or 51c) in the first fin type stacked layer structure and semiconductor layer WL/BL (52a, 52b, or 52c) in the second fin type stacked layer structure.

As the memory cells, it is possible to employ, as they are, memory cells for use in a resistance change element whose resistance value changes in accordance with a voltage, a current, heat or the like, or a resistance change type memory such as a resistance random access memory (ReRAM), a phase change memory (PCM), or a magnetic random access memory (MRAM).

Both ends of semiconductor layer WL/BL (51a, 51b, or 51c) in the first fin type stacked layer structure in the second direction are connected to beams 35 extending in the third direction. For example, beams 35 have the same structure as the first fin type stacked layer structure.

Similarly, both ends of semiconductor layer WL/BL (52a, 52b, or 52c) in the second fin type stacked layer structure in the third direction are connected to beams 35 extending in the second direction. For example, beams 35 have the same structure as the second fin type stacked layer structure.

Beams 35 are provided to fix the first and second fin type stacked layer structures, thereby preventing the collapse of the structures. A width of each beam 35 connected to the first fin type stacked layer structure in the second direction is preferably greater than a width of the first fin type stacked layer structure in the third direction, i.e., the width of each of semiconductor layers WL/BL (51a, 51b, and 51c) in the third direction.

Moreover, a width of each beam 35 connected to the second fin type stacked layer structure in the third direction is preferably greater than a width of the second fin type stacked layer structure in the second direction, i.e., the width of each of semiconductor layers WL/BL (52a, 52b, and 52c) in the second direction.

Between semiconductor layer WL/BL (51a, 51b, or 51c) in the first fin type stacked layer structure and beam 35, assist gate transistor AGT is disposed. Also between semiconductor layer WL/BL (52a, 52b, or 52c) in the second fin type stacked layer structure and beam 35, assist gate transistor AGT is disposed.

Assist gate transistors AGT may function as switches. Assist gate transistors AGT can be constituted of, for example, transistors having a metal-oxide-semiconductor (MOS) structure.

At an end of beam 35 of the first fin type stacked layer structure in the third direction, there is added a function of selecting one of semiconductor layers 51a, 51b, and 51c. Moreover, at an end of beam 35 of the second fin type stacked layer structure in the second direction, there is added a function of selecting one of semiconductor layers 52a, 52b, and 52c.

Similarly to the second embodiment, the function is realized by layer select transistors LSTa, LSTb, and LSTc. A constitution of these transistors is the same as in the second embodiment, and hence the detailed description thereof is omitted herein.

An important respect lies in that normally-on channels 41a, 41b, and 41c of layer select transistors LSTa, LSTb, and LSTc are respectively constituted of metal silicide channels.

In the present embodiment, the number of the first or second fin type stacked layer structures is four, but the present invention is not limited to this embodiment. That is, the number of the first or second fin type stacked layer structures may be two or more.

It is to be noted that the larger number of the first or second fin type stacked layer structures is more suitable for higher capacity of a nonvolatile semiconductor memory device.

(4) Fourth Embodiment

Figure 26:
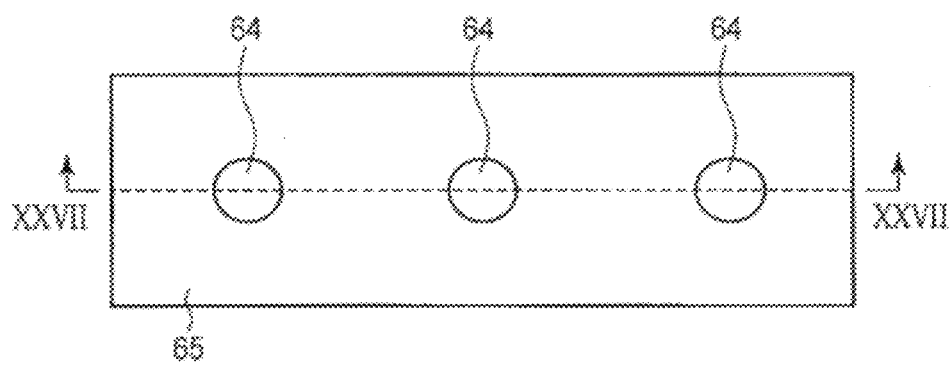
FIG. 26 is a view showing a semiconductor device as a fourth embodiment.
Figure 27:
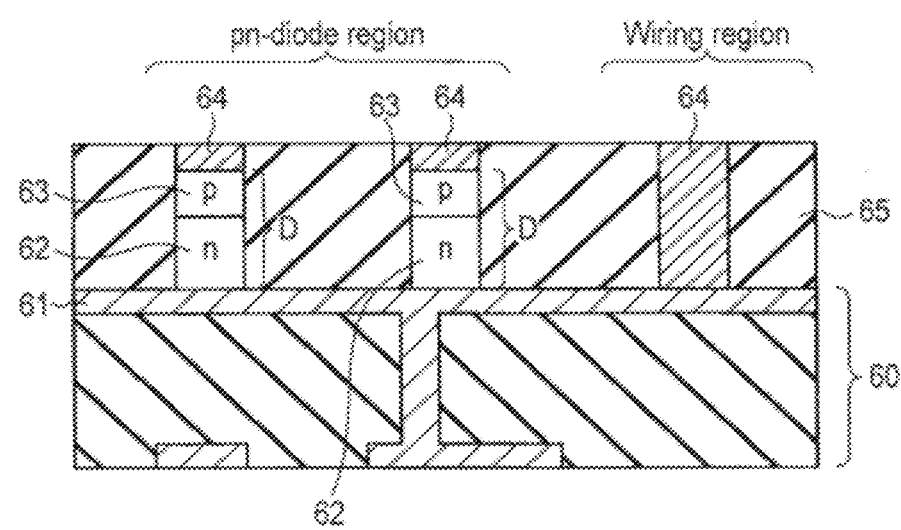
FIG. 27 is a sectional view taken along XXVII-XXVII line of FIG. 26.

FIG. 26 shows a structure of a fourth embodiment. FIG. 27 is a sectional view taken along XXVII-XXVII line of FIG. 26.

This embodiment relates to a semiconductor device comprising a rectifying element (a pn-diode) and a low-resistance fine wiring line.

For example, on conductive layer 61 in wiring layer 60 of LSI, there is disposed insulating layer 65 having first and second recess portions whose bottoms reach conductive layer 61.

In a pn-diode region, diode D comprising n-type semiconductor layer (n-type region) 62 and p-type semiconductor layer (p-type region) 63 is formed in the first recess portion of insulating layer 65. On p-type semiconductor layer 63, metal silicide layer 64 is formed.

Moreover, in a wiring region, metal silicide layer 64 as a low-resistance fine wiring line is formed in the second recess portion of insulating layer 65. Metal silicide layer 64 is obtained by bringing an amorphous semiconductor layer provided in the second recess portion to a silicide.

This semiconductor layer can be formed using a semiconductor layer deposited when forming pn-diode D. For example, arsenic (As) for use when forming a cathode (the n-type region) of pn-diode D is beforehand implanted in the whole semiconductor layer in the second recess portion of the wiring region. In consequence, the whole semiconductor layer in the second recess portion of the wiring region can be brought to the metal silicide, and the fine wiring line can easily be formed.

In the present embodiment, the fine wiring line is intended to be a contact plug. In this case, a width of the contact plug (a diameter when a planar shape is round) is preferably 15 nm or smaller. Moreover, the present embodiment can be applied to a wiring line having wiring width Wφ. In this case, a width (wiring width Wφ) of the second recess portion in the wiring region is preferably 15 nm or smaller.

Additionally, metal silicide layer 64 preferably includes Ni, V, Cr, Mn, Y, Mo, Ru, Rh, Hf, Ta, W, Ir, Co, Ti, Er, Pt, Pd, Zr, Gd, Dy, or Ho.

Figure 28:
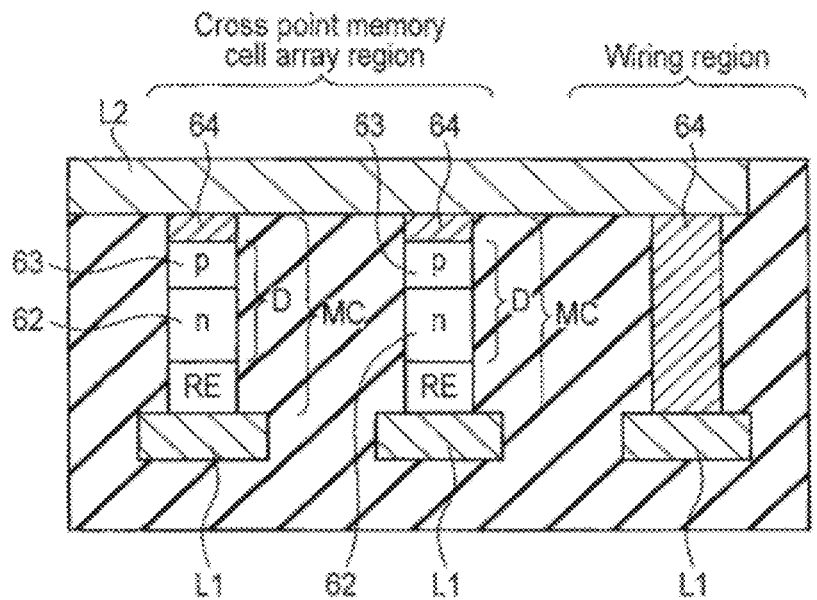
FIG. 28 and FIG. 29 are views showing modifications of the fourth embodiment.
Figure 29:
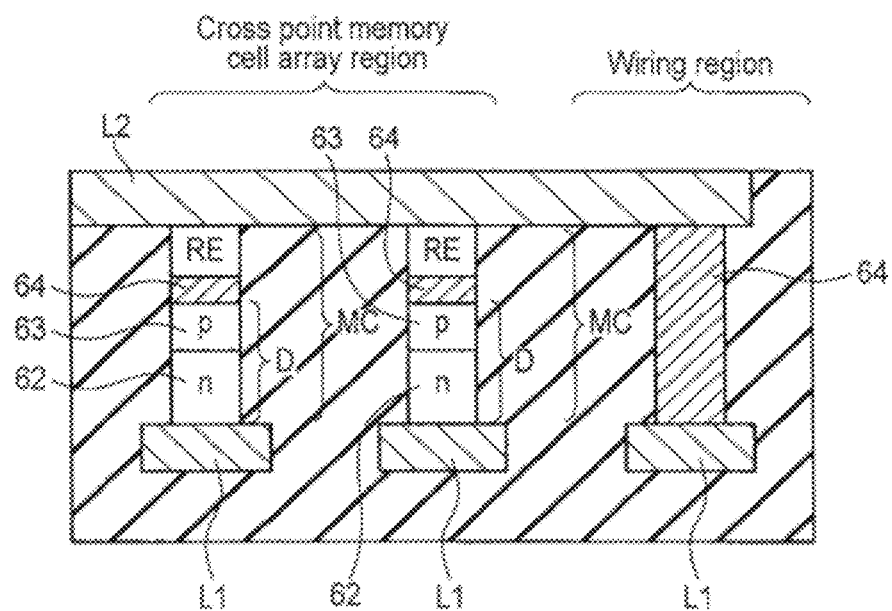

FIG. 28 and FIG. 29 show modifications of the fourth embodiment.

These modifications are characterized in that diode D shown in FIG. 26 and FIG. 27 is used as a rectifying element of each memory cell MC in a cross point type memory cell array. That is, diode D and resistance change element RE are stacked on each other. There are not any special restrictions on a stacking order thereof.

For example, in the example of FIG. 28, resistance change element RE is disposed on conductive wire L1, pn-diode (n-type region 62 and p-type region 63) D is disposed on resistance change element RE, and conductive wire L2 is disposed on pn-diode D via metal silicide layer 64.

Moreover, in the example of FIG. 29, pn-diode (n-type region 62 and p-type region 63) D is disposed on conductive wire L1, resistance change element RE is disposed on pn-diode D via metal silicide layer 64, and conductive wire L2 is disposed on resistance change element RE.

Such a structure is effective, especially when the cross point type memory cell array is three-dimensionally formed. In this case, for example, to connect stacked memory cell arrays to a peripheral circuit on a semiconductor substrate, it is necessary to form contact plugs PG in layers in which memory cells (diodes D and resistance change elements RE) MC are formed.

The present embodiment can be applied to the formation of this contact plug PG.

Heretofore, contact plugs PG have to be formed separately from memory cells MC, and hence there has been a problem that as the number of the stacked memory cell arrays increases, manufacturing cost rises owing to the increase of manufacturing processes. In contrast, according to the present embodiment, contact plugs PG can be formed in parallel with the formation of memory cells MC. Therefore, even when the number of the stacked memory cell arrays increases, the manufacturing cost does not rise.

Next, a method of manufacturing the device shown in FIG. 26 and FIG. 27 will be described.

First, as shown in FIG. 30, insulating layer 65 is formed on conductive layer 61 in wiring layer 60 of LSI by a CVD process. Moreover, recess portions 66 are formed in insulating layer 65 by photolithography and dry etching. A width (a diameter) of each of recess portions 66 is from 3 to 15 nm.

Next, as shown in FIG. 31, a silicon layer to fill recess portions 66 is deposited on insulating layer 65, and then the silicon layer is planarized by CMP. In consequence, pillar-like silicon layers 67 are formed in recess portions 66.

Figure 32:
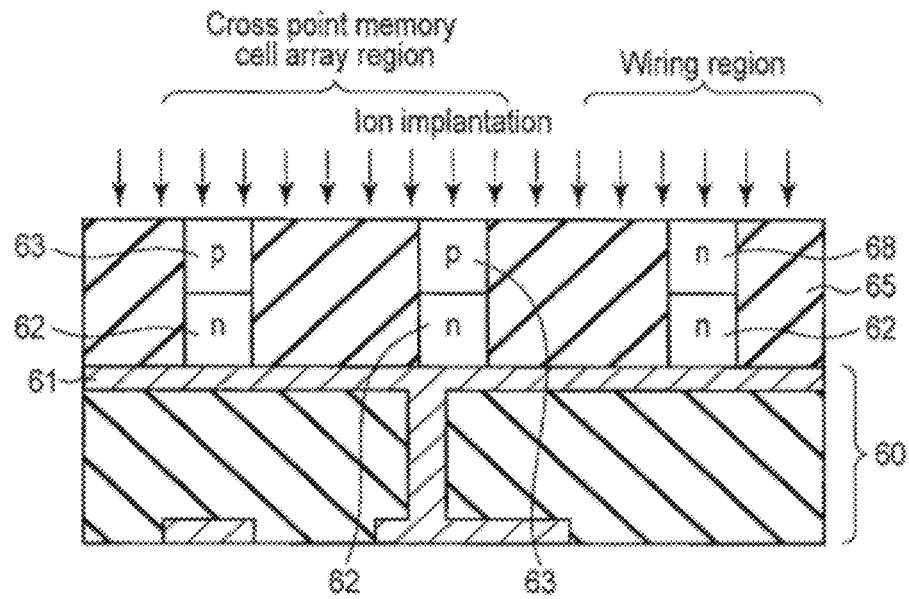

Next, as shown in FIG. 32, arsenic is implanted as an n-type impurity in silicon layers 67 of a pn-diode region and a wiring region through ion implantation. This ion implantation is performed for the purposes of controlling an acceleration voltage and a dose amount to form a cathode (an n-type region) of a diode, and amorphizing lower portions of silicon layers 67 in the wiring region.

Moreover, silicon layers 67 in the wiring region are covered with a resist, and then boron is implanted as a p-type impurity in silicon layers 67 of the pn-diode region through ion implantation. This ion implantation is performed for the purpose of controlling an acceleration voltage and a dose amount to form an anode (a p-type region) of the diode. The resist is removed afterwards.

Furthermore, silicon layers 67 in the pn-diode region are covered with a resist, and then arsenic is implanted as an n-type impurity in silicon layers 67 of the wiring region through ion implantation. This ion implantation is performed for the purpose of controlling an acceleration voltage and a dose amount to amorphize upper portions of silicon layers 67 in the wiring region. The resist is removed afterwards.

Figure 33:
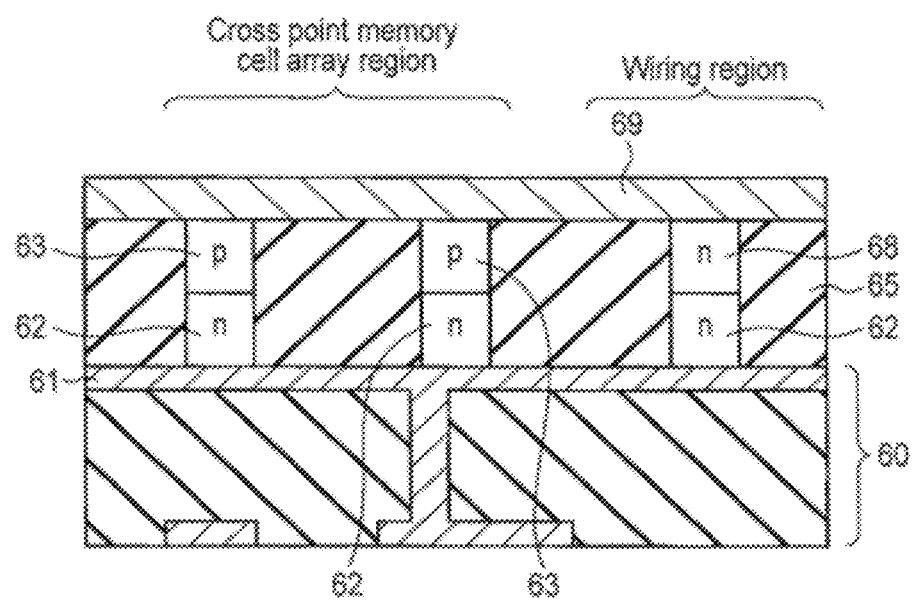

Next, as shown in FIG. 33, metal layer (e.g., nickel layer) 69 which comes in contact with silicon layers 67 in the pn-diode region and the wiring region is formed on insulating layer 65. Afterward, a heat treatment is performed to cause a silicide reaction between metal layer 69 and silicon layer 67, thereby forming a metal silicide layer.

At this time, silicon layer 67 amorphized by the implantation of arsenic comes in contact with metal layer 69 in the wiring region, and hence the silicide reaction between metal layer 69 and silicon layer 67 is promoted. In consequence, substantially all silicon layers 67 in the recess portions change to metal silicide layers.

In contrast, silicon layer 67 as the p-type region in which boron is implanted comes in contact with metal layer 69 in the pn-diode region, and hence the silicide reaction between metal layer 69 and silicon layer 67 is not promoted. In consequence, only upper portions of silicon layers 67 change to metal silicide layers. That is, the pn-diode (n-type region 62 and p-type region 63) remains as it is in the pn-diode region.

Unreacted metal layer 69 is removed afterwards.

The structure shown in FIG. 26 and FIG. 27 can be obtained by the above steps.

Additionally, a thickness of insulating layer 65 (a depth of the recess portion) is preferably 20 nm or smaller, so that the silicide reaction reaches the upper surface of conductive layer 61.

According to the fourth embodiment, the diode and the wiring line (including the contact plug), which have heretofore been formed separately, can simultaneously be formed. Therefore, process cost can noticeably be lowered. Moreover, the diode and wiring line formed in the same wiring layer can simultaneously be laid out by one lithography process. Consequently, it is possible to achieve both the enhancement of a positioning precision and the enhancement of a manufacturing yield.

It is to be noted that in the present example, pillar-like silicon layers 67 are made of monocrystalline silicon or polycrystalline silicon. When the polycrystalline silicon is used, a heat treatment can be performed to increase crystal grain size, with the result that the polycrystalline silicon can be allowed to approach monocrystalline silicon. When pillar-like silicon layers 67 are formed to be monocrystalline, it is possible to enhance characteristics of the diodes formed in the layers (the enhancement of rectifying properties, leak current characteristics or the like).

(5) Fifth Embodiment

Figure 34:
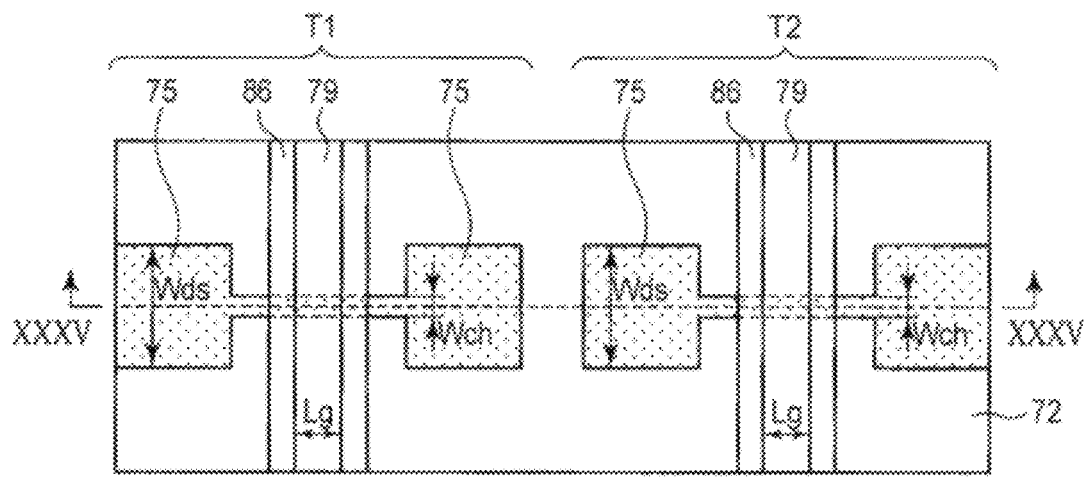
FIG. 34 is a view showing a semiconductor device as a fifth embodiment.
Figure 35:
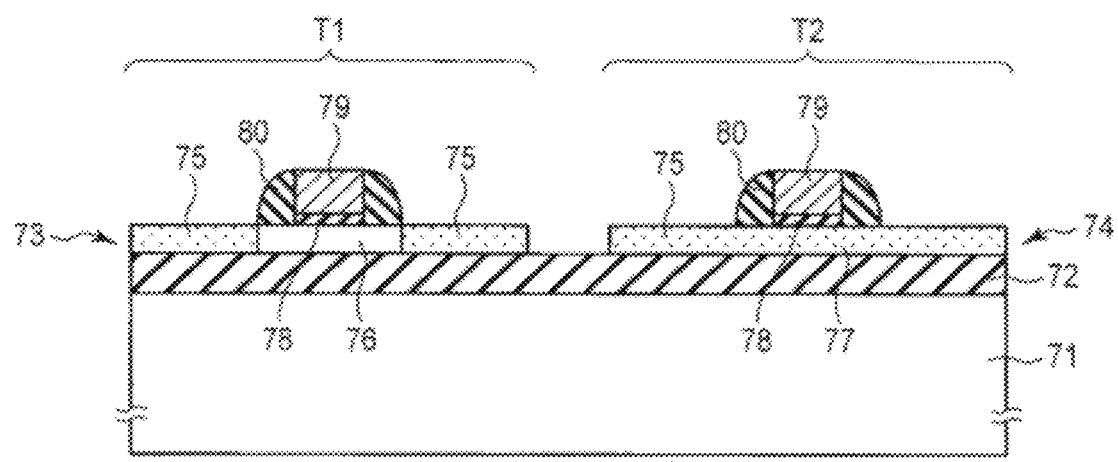
FIG. 35 is a sectional view taken along XXXV-XXXV line of FIG. 34.

FIG. 34 shows a structure of a fifth embodiment. FIG. 35 is a sectional view taken along XXXV-XXXV line of FIG. 34.

This embodiment relates to a semiconductor device comprising a field effect transistor (FET) which is formed on a silicon on insulator (SOI) substrate and which can be controlled to be on or off, and an FET which is always on (normally on).

For example, insulating layer 72 is disposed on semiconductor substrate 71, and first and second semiconductor layers (e.g., monocrystalline silicon layers) 73 and 74 are disposed on insulating layer 72.

First and second semiconductor layers 73 and 74 are both processed so that width Wch of a channel section (corresponding to a channel width of the FET) becomes smaller than width Wds of a source/drain region. For example, width Wch of the channel section is set to be 15 nm or smaller so that a capillary phenomenon remarkably occurs during metal silicide formation described later.

Figure 36:
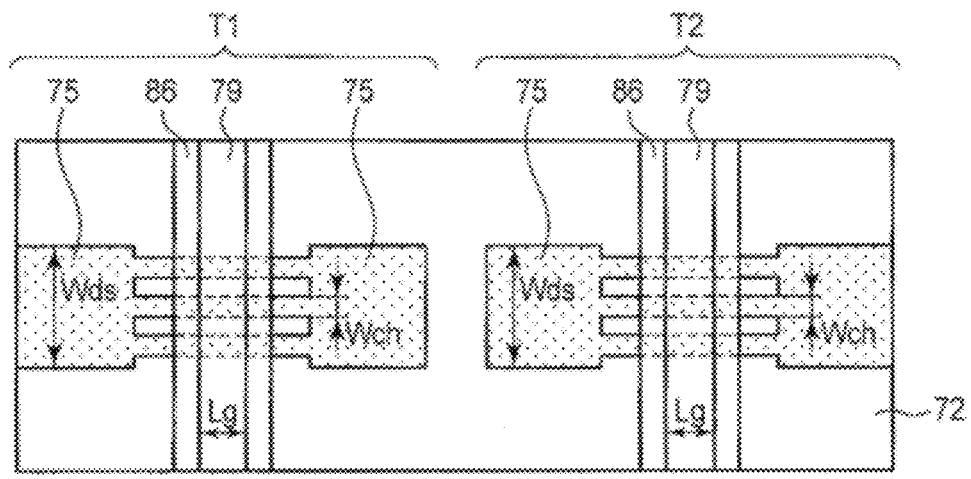
FIG. 36 is a view showing a modification of the fifth embodiment.

Here, when the channel width of the FET narrows, an on-current thereof becomes low. If a sufficient on-current cannot be obtained owing to the narrowed channel width, for example, a planar shape of first and second semiconductor layers 73 and 74 can be ladder-like as shown in FIG. 36. In this case, the source region and the drain region are connected to each other via channel sections each having width Wch. Moreover, the channel width of the FET becomes Wch×(the number of the channel sections), and a sufficiently large on-current can be acquired.

On first and second semiconductor layers 73 and 74, gate electrode (e.g., a polysilicon layer, a metal layer, a stacked layer of these layers, or the like) 79 is disposed via gate insulating layer (e.g., silicon oxide layer) 78. On the side surfaces of gate electrode 79, side wall insulating layer 80 is disposed.

In both first and second FETs T1 and T2, part or all of source/drain regions on both sides of gate electrode 79 has a metal silicide. In the present embodiment, all the source/drain regions are constituted of metal silicide layer (e.g., nickel silicide layer) 75.

Moreover, a channel section of first FET T1 is constituted of semiconductor layer 76. That is, the channel section of first FET T1 is not brought to the metal silicide. Therefore, first FET T1 is a transistor which can be controlled to be on or off.

Furthermore, a channel section of second FET T2 is constituted of metal silicide layer 77. That is, the channel section of second FET T2 has a metal silicide. Therefore, second FET T2 is a normally-on transistor which cannot be controlled to be on and off.

Additionally, gate length (channel length) Lg of each of first and second FETs T1 and T2 is preferably 40 nm or smaller so that the channel section is completely brought to the metal silicide. Moreover, metal silicide layers 75 and 77 preferably include Ni, V, Cr, Mn, Y, Mo, Ru, Rh, Hf, Ta, W, Ir, Co, Ti, Er, Pt, Pd, Zr, Gd, Dy, or Ho.

According to such a structure, it is possible to form the usual transistor which can be controlled to be on or off and the normally-on transistor which cannot be controlled to be on and off in parallel by the same process. Therefore, process cost can noticeably be lowered.

Moreover, it is possible to use first and second FETs T1 and T2 as elements having a memory function. That is, a normally-on state and a non-normally-on state can be stored as two states.

Next, a method of manufacturing the device shown in FIG. 34 and FIG. 35 will be described.

Figure 37:
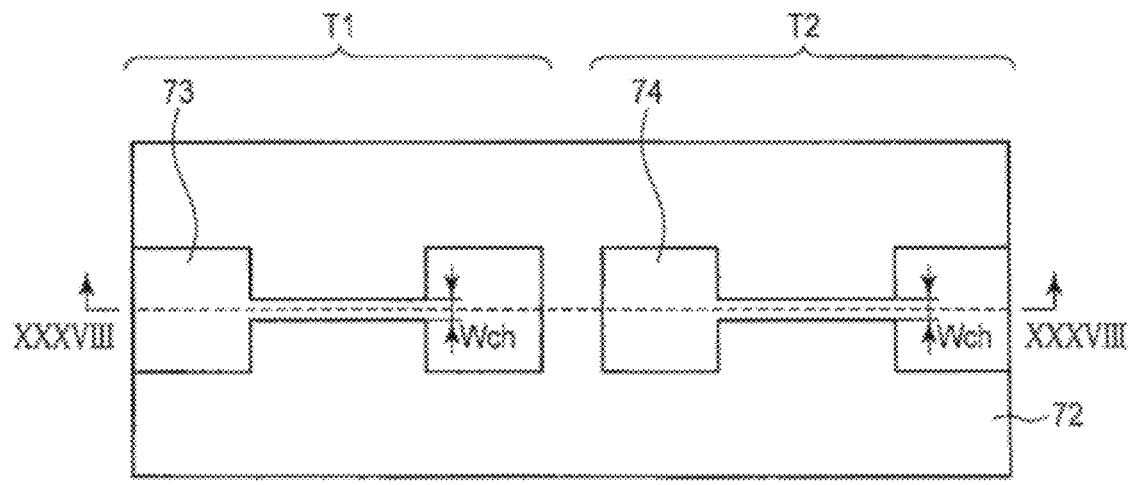

First, as shown in FIG. 37 and FIG. 38, insulating layer 72 is formed on semiconductor substrate 71, and first and second semiconductor layers 73 and 74 are formed on insulating layer 72. First and second semiconductor layers 73 and 74 can be formed, for example, by forming a monocrystalline semiconductor layer on the whole insulating layer 72 and then patterning this monocrystalline semiconductor layer.

Additionally, width Wch of a channel section of each of first and second semiconductor layers 73 and 74 is from 3 to 15 nm.

Next, as shown in FIG. 39, arsenic is implanted as an n-type impurity in second semiconductor layer 74 in which a normally-on transistor is formed, through ion implantation. This ion implantation is performed for the purpose of controlling an acceleration voltage and a dose amount to amorphize second semiconductor layer 74.

Figure 40:
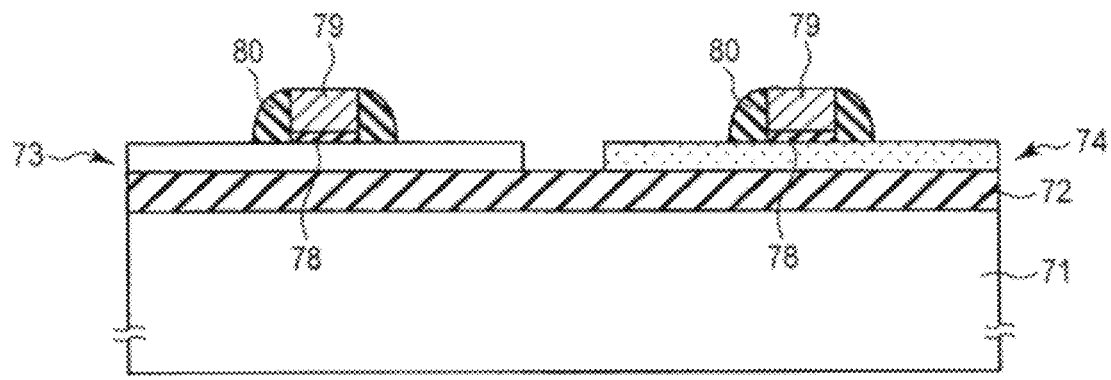

Next, as shown in FIG. 40, for example, a silicon oxide layer and a conductive polysilicon layer including the impurity are formed on first and second semiconductor layers 73 and 74, and then these layers are patterned by PEP and RIE. In consequence, gate insulating layer 78 and gate electrode 79 are formed on first and second semiconductor layers 73 and 74.

Subsequently, an insulating layer which covers gate electrode 79 is formed, and then this insulating layer is anisotropically etched, to form side wall insulating layer 80 on the side surfaces of gate electrode 79.

Figure 41:
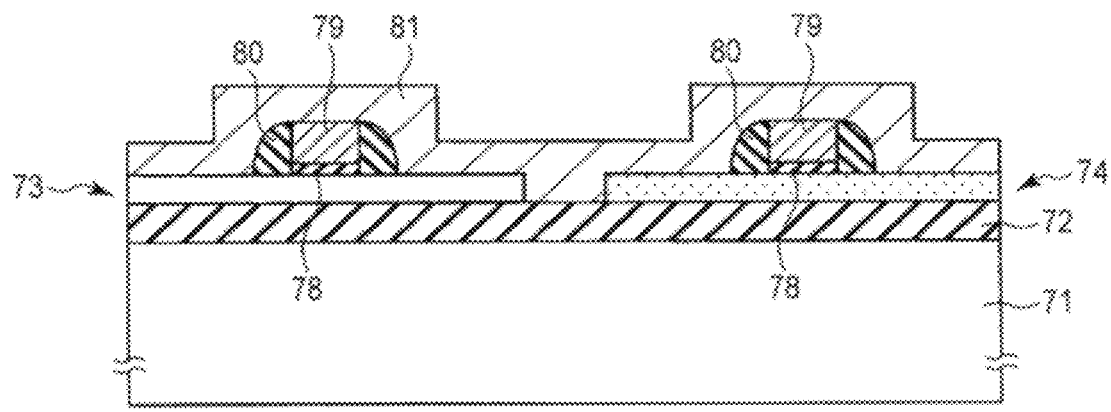

Next, as shown in FIG. 41, metal layer (e.g., nickel layer) 81 is formed on first and second semiconductor layers 73 and 74 and gate electrodes 79. Afterward, a heat treatment is performed to cause a silicide reaction between metal layer 81 and first and second semiconductor layers 73 and 74, thereby forming a metal silicide layer.

At this time, first semiconductor layer (region where the transistor which can be controlled to be on or off is formed) 73 is not amorphized by the implantation of arsenic, and hence the silicide reaction between metal layer 81 and second semiconductor layer 74 is not promoted. In consequence, the only source/drain region changes to the metal silicide layer. That is, the channel section right under gate electrode 79 does not change to the metal silicide layer.

In contrast, second semiconductor layer (region where the normally-on transistor is formed) 74 is amorphized by the implantation of arsenic, and hence the silicide reaction between metal layer 81 and second semiconductor layer 74 is promoted. In consequence, substantially all of the channel section (the narrowed section) right under gate electrode 79 changes to the metal silicide layer, in addition to the source/drain region.

Additionally, in the present embodiment, when gate electrode 79 is constituted of the polysilicon layer, the upper portion of gate electrode 79 can be brought to the silicide during the above-mentioned suicide reaction (self-aligned silicide process).

Unreacted metal layer 81 is removed afterwards.

The structure shown in FIG. 34 and FIG. 35 can be obtained by the above steps.

Additionally, gate length (channel length) Lg of the FET is preferably 40 nm or smaller, so that all of the channel section of second semiconductor layer 74 has the silicide.

According to the fifth embodiment, the usual transistor which can be controlled to be on or off and the normally-on transistor which cannot be controlled to be on and off can be formed in parallel through the same process, for example, by adding ion implantation once, and selectively performing the ion implantation of the impurity implantation region.

Heretofore, it has been necessary to separately form the usual transistor which can be controlled to be on or off and the normally-on transistor which cannot be controlled to be on and off (equivalent to a metal wiring line), but according to the present embodiment, these transistors can simultaneously be formed. Therefore, process cost can noticeably be lowered.

Moreover, in the present embodiment, the usual transistor and the normally-on transistor functioning as the metal wiring line have the same pattern, and hence in-plane uniformities of these transistors are high (less fluctuations in a vertical direction). Therefore, it is possible to enhance lithography process precision and yield.

In the present embodiment, first and second semiconductor layers 73 and 74 are made of monocrystalline silicon or polycrystalline silicon. When the polycrystalline silicon is used, the heat treatment can be performed to increase the crystal grain size, with the result that the polycrystalline silicon can be allowed to approach the monocrystalline silicon. When first and second semiconductor layers 73 and 74 are monocrystalline, characteristics (on/off-characteristics, or the like) of the transistors formed in the layers can be enhanced.

Figure 42:
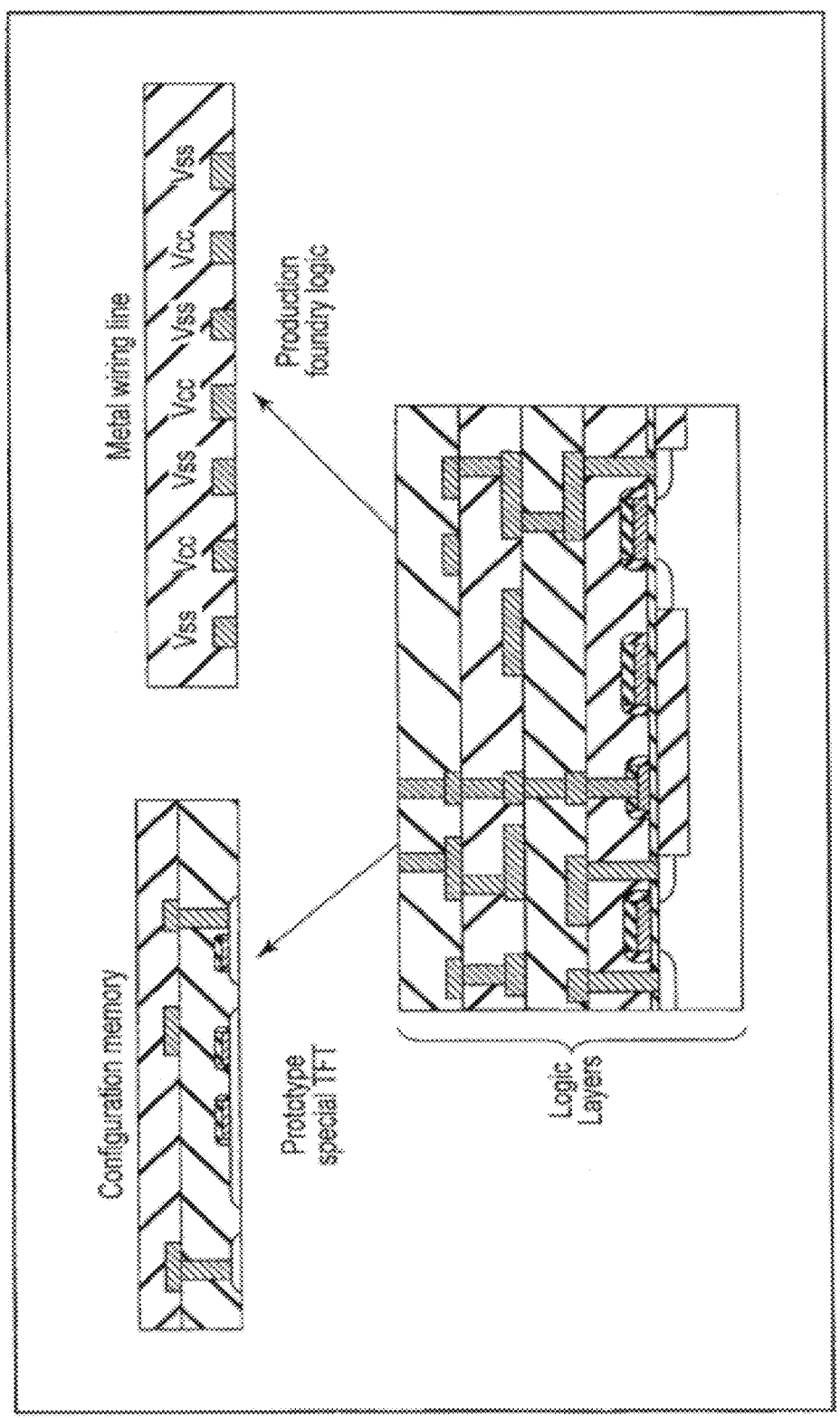
FIG. 42 is a view showing an FPGA as a sixth embodiment.

FIG. 42 shows an application example of the fifth embodiment.

The fifth embodiment can be applied to a three-dimensional field programmable gate array (FPGA). In the three-dimensional FPGA, a configuration memory (a rewritable memory to store circuit information) constituted of a thin film transistor (TFT) such as a polycrystalline silicon channel transistor is formed on logic LSI constituted of a transistor layer and a wiring layer. Additionally, the configuration memory is a memory to hold selection information of the logic LSI.

The semiconductor device of the fifth embodiment can be applied to this configuration memory.

For example, in an LSI development stage, first a prototype FPGA for development comprising the configuration memory (e.g., an SRAM) constituted of the TFT is manufactured to realize LSI specifications, and a test operation is repeated while rewriting the configuration memory.

When circuit design which satisfies the specifications is verified, an operation of replacing the configuration memory with a metal wiring line is then performed. That is, the metal wiring line equivalent to the configuration memory constituted of the TFT is designed, to manufacture the FPGA for mass production comprising, in the uppermost layer thereof, the metal wiring line for realizing a circuit which satisfies the LSI specifications and enables a high-speed operation.

Here, it can be considered that the operation of replacing the configuration memory with the metal wiring line is an operation of distinguishing a transistor which is to be always on (to function as the metal wiring line) and a transistor which is to be always off among the transistors constituting the configuration memory, and forming the transistor which is to be always on as the metal wiring line.

Therefore, the fifth embodiment is applied to the configuration memory, and an impurity is selectively implanted to selectively form the transistor which is to be always on (the normally-on transistor) and the transistor which is to be always off (the usual transistor). In this case, a conventional metal wiring line design operation can be replaced with the metal silicide formation in the fifth embodiment.

Thus, when the fifth embodiment is applied to the operation of replacing the configuration memory in the three-dimensional FPGA with the metal wiring line, it is not necessary to newly design the metal wiring line. It is possible to use, as it is, a mask for forming the configuration memory for use in the FPGA for development. Moreover, when the impurity to form the metal silicide is only selectively implanted, the FPGA for mass production can be manufactured.

That is, the application of the fifth embodiment mostly eliminates differences between a manufacturing process of the FPGA for development and a manufacturing process of the FPGA for mass production. Therefore, unlike a conventional technology in which it is necessary to design the metal wiring line in the FPGA for mass production, process cost can be lowered.

Hereinafter, a circuit example of the FPGA comprising the configuration SRAM will be described.

FIG. 43 shows an example of a layout of the FPGA.

FPGA 111 comprises input (I)/output (O) section 112, logic section L, wiring section 113, and digital signal processor (DSP)/block RAM section 114. I/O section 112 is disposed along the outer periphery of FPGA (chip) 111, and a greater part of the chip is occupied by logic section L and wiring section 113. In wiring section 113, logic blocks BK in logic section L are provided with wires.

Additionally, DSP/block RAM section 114 can be omitted, but more products each comprising the section are usually present.

Figure 44:
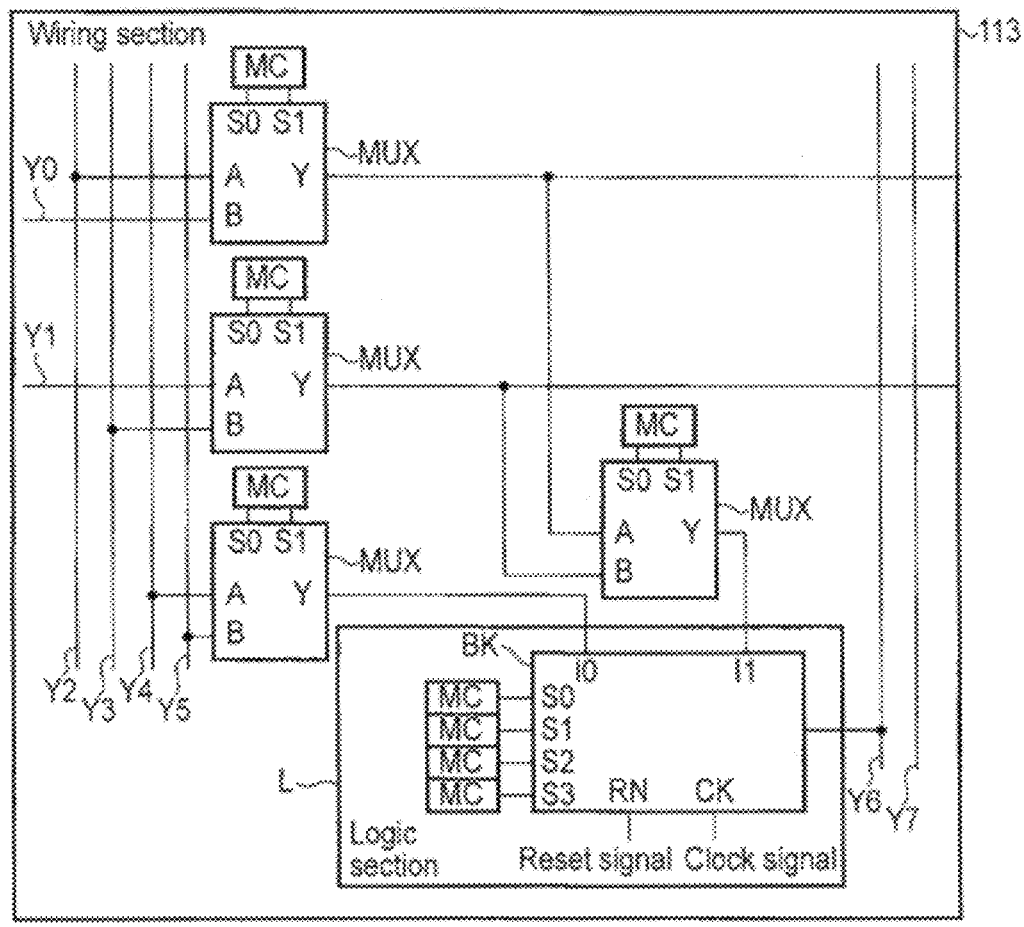
FIG. 44 is a view showing a logic section and a wiring section in the FPGA.

FIG. 44 shows a relation between logic section L and wiring section 113 shown in FIG. 43.

Input signals I0 and I1 from wiring section 113 are input into logic blocks BK in logic section L, and output signals O of logic blocks BK are output through signal lines Y6 and Y7 in wiring section 113. Logic blocks BK are controlled in accordance with data (e.g., a positive signal alone) from memory cells (MCs) of the configuration SRAM.

Multiplexers MUX in wiring section 113 selectively output, for example, input signals through signal lines Y0 to Y5. Multiplexers MUX are controlled in accordance with data (e.g., the positive signal and its reverse signal) from the configuration SRAM MCs.

Figure 45:
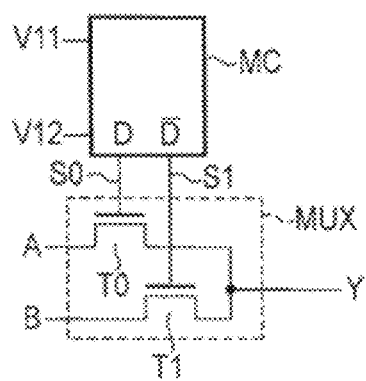
FIG. 45 is a view showing an example of a multiplexer.
Figure 46:
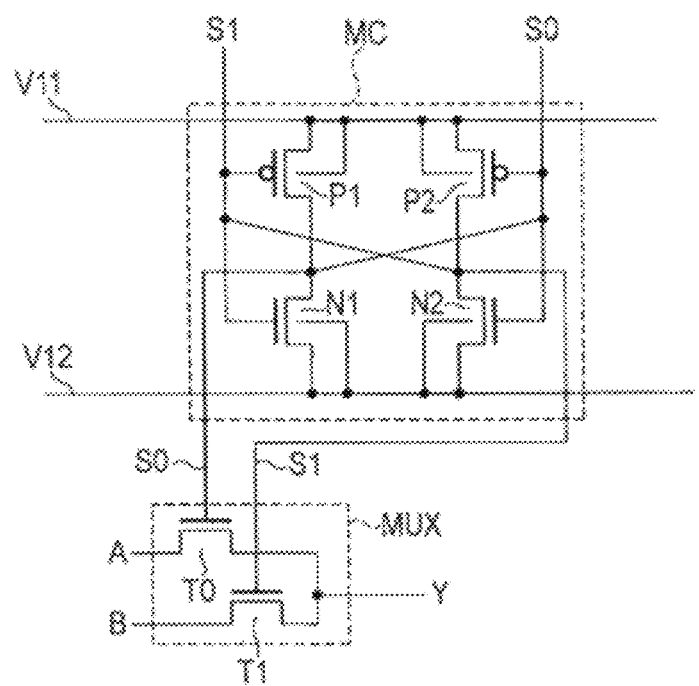
FIG. 46 is a view showing a configuration SRAM at the time of development.
Figure 47:
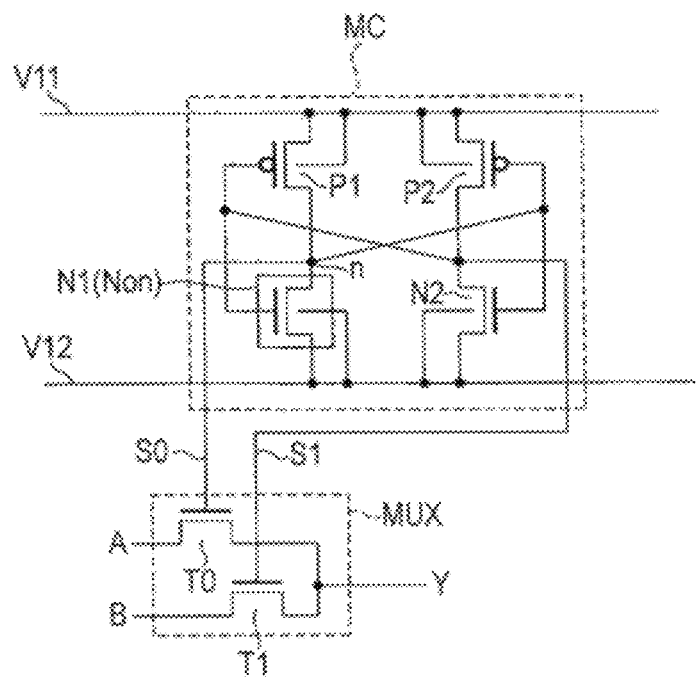
FIG. 47 is a view showing the configuration SRAM at the time of mass production.

FIG. 45 to FIG. 47 show examples of the configuration SRAM and the multiplexer in the FPGA for development.

Multiplexer MUX is a two-input multiplexer, and comprises two pass transistors (N-channel MOS transistors) T0 and T1.

Two-input multiplexer MUX outputs one of two input signals A and B as output signal Y. Whether to select one of two input signals A and B is controlled in accordance with data (positive signal S0 and its reverse signal S1) from the configuration SRAM MC.

The configuration SRAM MC is constituted of P-channel MOS transistors P1 and P2 and N-channel MOS transistors N1 and N2. V11 is a first power source potential (e.g., a positive potential), and V12 is a second power source potential (e.g., a ground potential).

In the development stage of the LSI, as shown in, for example, FIG. 46, the data of the configuration SRAM MC is rewritable, and this realizes a circuit which satisfies the specifications of the LSI.

In contrast, in the mass production stage of the LSI, as shown in, for example, FIG. 47, the data of the configuration SRAM MC is fixed. For example, the channel section of N-channel MOS transistor N1 has a metal silicide, and this transistor is formed as normally-on transistor Non.

Consequently, in FIG. 47, when a power source is turned on (e.g., first power source potential V11 is supplied as the positive potential and second power source potential V12 is supplied as the ground potential), node n is short-circuited by means of second power source potential V12. Therefore, S0="L", S1="H", and input signal B is selected.

It is to be noted that in the present example, each of pass transistors T0 and T0 in the two-input multiplexer MUX is constituted of one N-channel MOS transistor, but, for example, a transfer gate constituted of one P-channel MOS transistor and one N-channel MOS transistor may be used instead.

3. Conclusion

According to embodiments, a resistance of a fine wiring line can simply be lowered.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate;
a fin type stacked layer structure which has first to n-th semiconductor layers (n is a natural number equal to or more than 2) that are stacked in a first direction perpendicular to a surface of the semiconductor substrate and which extends in a second direction parallel to the surface of the semiconductor substrate; and
first to n-th layer select transistors to select one of the first to n-th semiconductor layers,
wherein the i-th layer select transistor (i is one of 1 to n) among the first to n-th layer select transistors has a gate electrode which extends in the first direction on the surface of the fin type stacked layer structure that is located in a third direction perpendicular to the first and second directions, is normally on in the i-th semiconductor layer among the first to n-th semiconductor layers, and is controlled to be on or off in the remaining semiconductor layers other than the i-th semiconductor layer, and
a channel region of the i-th semiconductor layer which is covered with the gate electrode of the i-th layer select transistor has a metal silicide.

2. The device of claim 1,
wherein the fin type stacked layer structure has first to n-th memory strings, and
the i-th memory string among the first to n-th memory strings uses the i-th semiconductor layer as a channel, and comprises memory cells connected in series in the second direction.

3. The device of claim 2,
wherein each of the memory cells is an FET which has a recording layer and a control gate electrode and whose threshold value changes in accordance with a state of the recording layer.

4. The device of claim 1, further comprising:
first to m-th conductive layers (m is a natural number equal to or more than 2) which extend in the third direction; and
resistance change elements arranged between the first to n-th semiconductor layers and the first to m-th conductive layers.

5. The device of claim 1,
wherein a channel width of each of the first to n-th layer select transistors is 15 nm or smaller.

6. The device of claim 1,
wherein the channel region having the metal silicide includes one of Ni, V, Cr, Mn, Y, Mo, Ru, Rh, Hf, Ta, W, Ir, Co, Ti, Er, Pt, Pd, Zr, Gd, Dy and Ho.

7. The device of claim 1,
wherein the channel region having the metal silicide includes one of As, P, Si, Ge, F and C as an impurity.

8. The device of claim 1,
wherein the first to n-th semiconductor layers are made of one of silicon, germanium and silicon germanium.

9. A semiconductor device comprising:
a semiconductor substrate;
a fin type stacked layer structure which is disposed in a first direction perpendicular to a surface of the semiconductor substrate and which extends in a second direction parallel to the surface of the semiconductor substrate;
a beam which is connected to one end of the fin type stacked layer structure in the second direction and which extends in a third direction perpendicular to the first and second directions; and
first to n-th layer select transistors (n is a natural number equal to or more than 2) arranged on the surface of the beam that is located in the second direction,
wherein the fin type stacked layer structure and the beam have first to n-th semiconductor layers, the first to n-th layer select transistors select one of the first to n-th semiconductor layers,
the i-th layer select transistor (i is one of 1 to n) among the first to n-th layer select transistors has a gate electrode which extends in the first direction on the surface of the beam that is located in the second direction, is normally on in the i-th semiconductor layer among the first to n-th semiconductor layers, and is controlled to be on or off in the remaining semiconductor layers other than the i-th semiconductor layer, and
a channel region of the i-th semiconductor layer which is covered with the gate electrode of the i-th layer select transistor has a metal silicide.

10. The device of claim 9,
wherein the fin type stacked layer structure has first to n-th memory strings, and
the i-th memory string among the first to n-th memory strings uses the i-th semiconductor layer as a channel, and comprises memory cells connected in series in the second direction.

11. The device of claim 10,
wherein each of the memory cells is an FET which has a recording layer and a control gate electrode, and whose threshold value changes in accordance with a state of the recording layer.

12. The device of claim 9, further comprising:
first to m-th conductive layers (m is a natural number equal to or more than 2) which extend in the third direction; and
resistance change elements arranged between the first to n-th semiconductor layers and the first to m-th conductive layers.

13. The device of claim 9,
wherein a channel width of each of the first to n-th layer select transistors is 15 nm or smaller.

14. The device of claim 9,
wherein the channel region having the metal silicide includes one of Ni, V, Cr, Mn, Y, Mo, Ru, Rh, Hf, Ta, W, Ir, Co, Ti, Er, Pt, Pd, Zr, Gd, Dy and Ho.

15. The device of claim 9,
wherein the channel region having the metal silicide includes one of As, P, Si, Ge, F and C as an impurity.

16. The device of claim 9,
wherein the first to n-th semiconductor layers are made of one of silicon, germanium and silicon germanium.

17. A semiconductor device comprising:
a semiconductor substrate;
an insulating layer which is disposed on the semiconductor substrate and which has first and second recess portions;
a first semiconductor layer which is disposed in the first recess portion and which comprises an n-type region and a p-type region on the n-type region; and
a second semiconductor layer which is disposed in the second recess portion,
wherein the first semiconductor layer includes a metal silicide in an upper surface of the p-type region and the second semiconductor layer includes a metal silicide as a whole.

18. The device of claim 17, further comprising: a resistance change element which constitutes a stacked layer structure together with the first semiconductor layer.

19. The device of claim 17,
wherein a width of each of the first and second recess portions is 15 nm or smaller.

20. The device of claim 17, wherein the metal silicide includes one of Ni, V, Cr, Mn, Y, Mo, Ru, Rh, Hf, Ta, W, It, Co, Ti, Er, Pt, Pd, Zr, Gd, Dy and Ho.

21. The device of claim 17, wherein the metal silicide includes one of As, P, Si, Ge, F and C as an impurity.

22. A semiconductor device comprising:
a semiconductor substrate;
an insulating layer which is disposed on the semiconductor substrate;
first and second semiconductor layers which are disposed on the insulating layer;
a first FET which has a first gate electrode disposed on the first semiconductor layer and which is controlled to be on or off; and
a second FET which has a second gate electrode disposed on the second semiconductor layer and which is normally on,
wherein a channel of the second FET has a metal silicide.

23. The device of claim 22, further comprising:
a logic LSI which is disposed on the semiconductor substrate and which is covered with the insulating layer,
wherein the first and second FETs constitute a configuration memory which holds selection information of the logic LSI.

24. The device of claim 22,
wherein a channel width of each of the first and second FETs is 15 nm or smaller.

25. The device of claim 22,
wherein the channel region having the metal silicide includes one of Ni, V, Cr, Mn, Y, Mo, Ru, Rh, Hf, Ta, W, Ir, Co, Ti, Er, Pt, Pd, Zr, Gd, Dy and Ho.

26. The device of claim 22,
wherein the channel region having the metal silicide includes one of As, P, Si, Ge, F and C as an impurity.

27. A method of manufacturing the device of claim 1, the method comprising:
implanting, in the channel region of the i-th semiconductor layer which is covered with the gate electrode of the i-th layer select transistor, an impurity to amorphize the channel region;
forming a metal layer on the surface of a region of the i-th semiconductor layer which is not covered with the gate electrode of the i-th layer select transistor, in the third direction; and
selectively bringing a region in which the impurity is implanted to a silicide by a heat treatment.

28. The method of claim 27,
wherein the impurity includes one of As, P, Si, Ge, F and C.

29. A method of manufacturing the device of claim 9, the method comprising:
- implanting, in the channel region of the i-th semiconductor layer which is covered with the gate electrode of the i-th layer select transistor, an impurity to amorphize the channel region;
- forming a metal layer on the surface of a region of the i-th semiconductor layer which is not covered with the gate electrode of the i-th layer select transistor, in the second direction; and
- selectively bringing a region in which the impurity is implanted to a silicide by a heat treatment.

30. The method of claim 29,
wherein the impurity includes one of As, P, Si, Ge, F and C.

31. A method of manufacturing the device of claim 17, the method comprising:
- implanting, in the whole second semiconductor layer, an impurity to amorphize the whole second semiconductor layer;
- forming a metal layer on the first and second semiconductor layers; and
- selectively bringing a region in which the impurity is implanted to a silicide by a heat treatment.

32. The method of claim 31,
wherein the impurity includes one of As, P, Si, Ge, F and C.

33. A method of manufacturing the device of claim 22, the method comprising:
- implanting, in the whole second semiconductor layer, an impurity to amorphize the whole second semiconductor layer;
- forming a metal layer on the first and second semiconductor layers which are not covered with the first and second gate electrodes; and
- selectively bringing a region in which the impurity is implanted to a silicide by a heat treatment.

34. The method of claim 33,
wherein the impurity includes one of As, P, Si, Ge, F and C.

* * * * *